US010050704B1

(12) United States Patent
Yap

(10) Patent No.: US 10,050,704 B1
(45) Date of Patent: Aug. 14, 2018

(54) POWER EFFICIENT OPTICAL-FREQUENCY SYNTHESIZER

(71) Applicant: HRL Laboratories, LLC, Malibu, CA (US)

(72) Inventor: Daniel Yap, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/240,670

(22) Filed: Aug. 18, 2016

(51) Int. Cl.
| H04B 10/079 | (2013.01) |
| H01S 5/065 | (2006.01) |
| H01S 5/06 | (2006.01) |
| H01S 5/0687 | (2006.01) |
| G02B 6/293 | (2006.01) |

(Continued)

(52) U.S. Cl.
CPC ..... H04B 10/0795 (2013.01); G02B 6/12004 (2013.01); G02B 6/2861 (2013.01); G02B 6/29343 (2013.01); H01S 5/065 (2013.01); H01S 5/0617 (2013.01); H01S 5/0687 (2013.01)

(58) Field of Classification Search
CPC ............ H04B 10/0795; G02B 6/12004; G02B 6/2861; G02B 6/29343; H01S 5/0617; H01S 5/065; H01S 5/0687
See application file for complete search history.

(56) References Cited

U.S. PATENT DOCUMENTS 5,222,162 A * 6/1993 Yap ..................... G02B 6/12004
385/14
5,434,877 A * 7/1995 Chung ................. H04B 10/506
372/18

(Continued)

OTHER PUBLICATIONS

D. J. Jones, et al., "Carrier-envelope phase control of femtosecond mode-locked lasers and direct optical frequency synthesis," Science, Apr. 28, 2000, vol. 288, pp. 635-639.

(Continued)

Primary Examiner — Danny Leung
(74) Attorney, Agent, or Firm — Ladas & Parry

(57) ABSTRACT

Several embodiments of a system and method of an optical-frequency (OF) synthesizer are disclosed that produces an optical frequency (OF) tone derived from a dispersive resonator and phase-locking to a radio frequency (RF) tone to achieve high precision. Thus, the stability of the synthesized OF tone is related to the stability of the RF tone. A frequency control word provides for a wide range of programmability to the frequency of the output OF tone. The OF synthesizer establishes the absolute value of the optical frequency of its output tone by making use of a dispersive optical resonator and applying appropriate corrections obtained dynamically by interrogating the comb lines. The reference resonator defines a semi-dormant OF reference comb, wherein the lines of that reference comb are associated with the modes of the reference resonator. Several selected modes of this reference resonator are interrogated by locking the frequency of light emitted by lasers to those (Continued)

resonator modes. The few selected resonator modes are the active lines of this reference comb and the other lines of this comb remain dormant, until activated, thus making the OF synthesizer a power efficient synthesizer. Concepts are presented to integrate the various components of this OF synthesizer on a chip-scale monolithic substrate.

23 Claims, 16 Drawing Sheets

(51) Int. Cl.
*G02B 6/28* (2006.01)
*G02B 6/12* (2006.01)

(56) References Cited

U.S. PATENT DOCUMENTS

| | | | | |
|---|---|---|---|---|
| 9,683,846 | B2* | 6/2017 | Strandjord | G01C 19/727 |
| 2003/0089915 | A1* | 5/2003 | Yap | G02B 6/12004 |
| | | | | 257/82 |
| 2003/0090767 | A1* | 5/2003 | Yap | G02B 6/2861 |
| | | | | 398/183 |
| 2004/0264977 | A1* | 12/2004 | Yap | G02F 2/02 |
| | | | | 398/161 |
| 2008/0212974 | A1* | 9/2008 | Davies | H04B 10/2575 |
| | | | | 398/140 |
| 2009/0208209 | A1* | 8/2009 | Ng | G02B 6/12007 |
| | | | | 398/49 |
| 2013/0271770 | A1* | 10/2013 | Sanders | G01C 19/727 |
| | | | | 356/461 |
| 2014/0021986 | A1* | 1/2014 | Scott | H03L 7/16 |
| | | | | 327/156 |
| 2015/0325978 | A1* | 11/2015 | Fertig | H01S 3/13 |
| | | | | 372/32 |
| 2015/0326320 | A1* | 11/2015 | Fertig | H04B 10/503 |
| | | | | 398/115 |
| 2017/0146346 | A1* | 5/2017 | Strandjord | G01C 19/727 |
| 2017/0256909 | A1* | 9/2017 | Braddell | H01S 5/0656 |

OTHER PUBLICATIONS

R. Holzwarth, et al., "Optical Frequency Synthesizer for precision spectroscopy," Physical Review Letters, Sep. 11, 2000, vol. 85, No. 11, pp. 2264-2267.
H. R. Telle, et al., "Carrier-envelope offset phase control: A novel concept for absolute optical frequency measurement and ultrashort pulse generation," Applied Physics B, vol. 69, pp. 327-332 (1999).
B. R. Washburn, et al., "Fiber-laser-based frequency comb with a tunable repetition rate," Optics Express, Oct. 4, 2004, vol. 12, No. 20, pp. 4999-5003.
J. D. Jost, et al., "Continuously tunable, precise, single frequency optical signal generator," Optics Express, vol. 10, pp. 515-520 (2002).
J. Parker, et al., "Offset locking of an SG-SBR to an InGaAsP/InP mode-locked laser," pp. 846-847, IEEE 2012.
H. Lee, et al., "Spiral resonators for on-chip laser frequency stabilization," Nature Communications, 4:2468, DOI: 10.1038/ncomms3468 (Sep. 17, 2013).
W. C. Swann, et al., "Microwave generation with low residual phase noise from a femtosecond fiber laser with an intracavity electro-optic modulator," Optics Express, Nov. 21, 2011, vol. 19, No. 24, pp. 24387-24395.
Y. Y. Jiang, et al., "Making optical atomic clocks more stable with 10-16-level laser stabilization," Nature Photonics, Mar. 2011, vol. 5, pp. 158-161.
R. W. P. Drever, et al., "Laser phase and frequency stabilization using an optical resonator," Applied Physics B, vol. 31, pp. 97-105 (1983).
M. S. Taubman, et al., "Frequency stabilization of quantum-cascade lasers by use of optical cavities," Optics Letters, Dec. 15, 2002, vol. 27, No. 24, pp. 2164-2166.
A. D. Ludlow, et al., "Compact, thermal-noise-limited optical cavity for diode laser stabilization at 1x10-15," Optics Letters, Mar. 15, 2007, vol. 32, No. 6, pp. 641-643.
D. T. H. Tan et. al., "Group velocity dispersion and self phase modulation in silicon nitride waveguides," Applied Physics Letters, vol. 96, p. 061101 (2010).
L. Zhang, et al., "Silicon waveguide with four zero-dispersion wavelengths and its application in on-chip octave-spanning supercontinuum generation," Optics Express, Jan. 16, 2014, vol. 20, pp. 1685-1690.
Y. Okawachi, et al, "Octave-spanning frequency comb generation in a silicon nitride chip," Optics Letters, Sep. 1, 2011, vol. 36, No. 17, pp. 3398-3400.
A. C. Turner, et al., "Tailored anomalous group-velocity dispersion in silicon channel waveguides," Optics Express, May 15, 2006, vol. 14, No. 10, pp. 4357-4362.
L. Zhuang, et al., "Low-loss, high-index-contrast Si3N4/SiO2 optical waveguides for optical delay lies in microwave photonic signal processing," Optics Express, Nov. 7, 2011, vol. 19, No. 23, pp. 23162-23170.
J. F. Banters, et al., "Ultra-low-loss high-aspect-ratio Si3N4 waveguides," Optics Express, Feb. 14, 2011, vol. 19, No. 4, pp. 3163-3174.
W. You, et al., "Femtosecond cascaded third-harmonic generation with simultaneous walk-off effect by multi-grating periodically poled MgO-doped lithium niobate," Optical Engineering, May 2014, vol. 53, p. 056119.
S. Cheung et. al., "1-GHz monolithically integrated hybrid mode-locked InP laser," IEEE Photonics Technology Letters, Dec. 15, 2010, vol. 22, No. 24, pp. 1793-1795.
J. S. Parker et. al., "Frequency tuning in integrated InGaAsP/InP ring mode-locked lasers," Journal of Lightwave Technology, May 1, 2012, vol. 30, No. 9, pp. 1278-1283.
J. S. Parker et. al., "Highly-stable integrated InGaAsP/InP mode-locked laser and optical phase-locked loop," IEEE Photonics Technology Letters, Sep. 15, 2013, vol. 25, No. 18, pp. 1851-1854.
M. Lu, et al., "Highly integrated optical heterodyne phase-locked loop with phase/frequency detection," Optics Express, Apr. 23, 2012, vol. 20, No. 9, pp. 9736-9741.
"FC 1500 Optical Frequency Synthesizer" product brochure, Menlo Systems, accessed through: http://www.menlosystems.com/products/optical-frequency-combs/fc1500-250-wg/, accessed on Jun. 23, 2016.
"FC 1500 Optical Frequency Synthesizer" product brochure, Menlo Systems, available through "The Internet Archive Way Back Machine", https://web.archive.org/web/20131219105508/http://www.melosystems.com/products/optical-frequency-combs/fc1500-250-wg, archived Dec. 19, 2013, accessed Aug. 12, 2016.
"FC 1500-25-WG Optical Frequency Comb" Data Sheet, available at: http://www.menlosystems.com/products/optical-frequency-combs/fc1500-250-wg/, accessed Feb. 26, 2014.

* cited by examiner

| Bit # | Freq. | Bit # | Freq. | Bit # | Freq. | Bit # | Freq. |
|---|---|---|---|---|---|---|---|
| 1 | 0.72 | 14 | 4.88k | 27 | 40.00M | 40 | 327.7G |
| 2 | 1.44 | 15 | 9.77k | 28 | 80.00M | 41 | 755.4G |
| 3 | 2.88 | 16 | 19.53k | 29 | 160.0M | 42 | 1.511T |
| 4 | 4.77 | 17 | 39.06k | 30 | 320.0M | 43 | 3.021T |
| 5 | 9.54 | 18 | 78.13k | 31 | 640.0M | 44 | 6.043T |
| 6 | 19.07 | 19 | 156.25k | 32 | 1.280G | 45 | 12.09T |
| 7 | 38.14 | 20 | 312.50k | 33 | 2.560G | 46 | 24.17T |
| 8 | 76.29 | 21 | 625.00k | 34 | 5.120G | 47 | 48.34T |
| 9 | 152.6 | 22 | 1.250M | 35 | 10.24G | 48 | 96.69T |
| 10 | 305.1 | 23 | 2.50M | 36 | 20.48G | 49 | 193.4T |
| 11 | 610.4 | 24 | 5.00M | 37 | 40.96G | 50 | 396.7T |
| 12 | 1.22k | 25 | 10.00M | 38 | 81.92G | 51 | 793.5T |
| 13 | 2.44k | 26 | 20.00M | 39 | 163.8G | | |

Figure-5

POWER EFFICIENT OPTICAL-FREQUENCY SYNTHESIZER

TECHNICAL FIELD

The present disclosure is directed in general to the field of optical frequency synthesizers.

BACKGROUND OF THE DISCLOSURE

A variety of optical frequency synthesizers are known. However, these synthesizers suffer from poor efficiency, coarse spacing of multi-frequency combs, poor resolution, instability and other issues. While there is ever growing and urgent need for programmable, very high frequency (hundreds of GHz) and precise optical references, the prior art techniques are not suitable to synthesize these tones. For example, a single-frequency tunable laser offset locked by means of an analog phase-locking loop to a fixed-frequency reference laser can be considered an optical frequency (OF) synthesizer whose offset frequency (between these two lasers) is determined by an RF source. One possible RF source is an amplified electronic direct digital synthesizer (DDS) circuit coupled to a digital-to-analog converter (DAC) or DDS/DAC circuit. As the frequency of the RF source is varied, the OF output of the tunable laser likewise is varied. However, the span of frequencies that this OF synthesizer can produce is limited to the span of frequencies produced by the RF source, which is typically only several GHz for an electronic DDS/DAC.

Another example is a laser comb generator that can be provided by a mode-locked laser that produces a train of optical pulses or by coupling higher power CW laser light into an optical micro-resonator that produces a comb by means of cascaded four-wave mixing processes. Such a comb generator can be considered an OF synthesizer whose output frequency is obtained by selecting a line of the comb. However, the number of comb lines produced by such comb generator is limited. Typical chip-scale mode-locked lasers produce a comb of 10 to 100 lines, with 1000 lines being produced in extreme cases. Comb generators based on four-wave mixing in a micro-resonator likewise produce combs having at most several thousand lines (or tones). The combs produced by these comb generators can have span of frequency values exceeding an octave in some cases. However, the increment in the possible frequency values of such a synthesizer with a fixed-spacing comb is quite coarse, typically 10 GHz or larger for a compact comb generator of chip-scale size.

Hence there is an urgent need in the field of optical frequency synthesizers for a synthesizer that is highly efficient, compact, programmable and able to generate high frequency optical references with great precision and stability.

SUMMARY OF THE TECHNOLOGY

To address one or more of the above-deficiencies of the prior art, one or more embodiment described in this disclosure provides for a high resolution, high efficient and compact programmable OF synthesizer.

An embodiment of this disclosure discloses an optical frequency (OF) synthesizer comprising a reference generator, a mode-locked laser and an output laser, wherein the reference generator further comprises a resonator defining optical coarse-comb lines, a first laser and a second laser coupled to non-adjacent coarse-comb lines and a third laser coupled to a coarse-comb line located between the coarse-comb lines coupled to the first laser and the second laser; the mode-locked laser generating optical fine-comb lines, wherein two non-adjacent fine-comb lines are respectively coupled to and locked to a coarse-comb line and to its adjacent coarse-comb line; and the output laser is locked to a fine-comb line located between the two locked fine-comb lines, wherein the output laser is tuned to account for an offset correction computed from using outputs from one or more of the first and second lasers, the mode locked laser and the output laser, with the use of a radio frequency (RF) reference.

Another embodiment of this disclosure discloses an optical frequency (OF) synthesizer comprising a reference generator, and an output laser, wherein the reference generator further comprises a resonator defining optical comb lines, a first laser and a second laser coupled to non-adjacent comb lines and a third laser coupled to a comb line located between the comb lines coupled to the first laser and the second laser, and the output laser is locked to a comb line located near the comb line coupled to the third laser, wherein the output laser is tuned to account for a frequency offset correction computed from using outputs from one or more of the first, second and third lasers and the output laser, with the use of a radio frequency (RF) reference.

Yet another embodiment of this disclosure discloses a method of determining an absolute frequency of a mode of an optical resonator, comprising, coupling into two different modes of the resonator with light emitted by a first laser and by a second laser, wherein the $m^{th}$ harmonic of the first laser and the $n^{th}$ harmonic of second laser are about the same optical frequency where m and n are whole numbers, measuring a frequency difference between the $n^{th}$ harmonic light and the $m^{th}$ harmonic light using an RF reference, coupling a third light into the resonator and aligning the frequency of the third light with a mode of the resonator, controlling the difference between the frequencies associated with two modes of the resonator using a phase locking circuit, coupling the light aligned with a frequency associated with a mode of the resonator into the phase locking circuit and coupling light from a mode-locked laser into the resonator, wherein the frequency of a line of the optical comb produced by the mode-locked laser is aligned with the frequency associated with a mode of the resonator.

Yet another embodiment of this disclosure discloses a method of making an OF synthesizer module on a chip, comprising, fabricating one or more lasers and resonators nested in a spiral configuration on a monolithic substrate, integrating optic chips with waveguides on the same substrate, integrating optical coupling interfaces and active photonics chips on the same substrate, integrating one or more of saturable optical absorbers, optical gain elements (or optical amplifiers), modulators, micro-resonators and photo detectors, and integrating complementary metal oxide semiconductor (CMOS) electronic chips on the same substrate so as to function as an OF synthesizer.

Certain embodiments may provide various technical features depending on the implementation. For example, a technical feature of some embodiments may include the capability to provide a wider range of programmability of the optical frequency output while others may use fewer components and/or higher resolutions and/or a compact design.

Although specific features have been enumerated above, various embodiments may include some, none, or all of the enumerated features. Additionally, other technical features may become readily apparent to one of ordinary skill in the art after review of the following figures and description,

BRIEF DESCRIPTION OF THE DRAWINGS

For a more complete understanding of the present disclosure and its features, reference is now made to the following description taken in conjunction with the accompanying drawings, in which like reference numerals represent like parts:

FIG. 5 illustrates an example of optical frequency offset values derived from 10 MHz by binary division or multiplication. according to an embodiment of the present disclosure;

DETAILED DESCRIPTION

Figure 1:
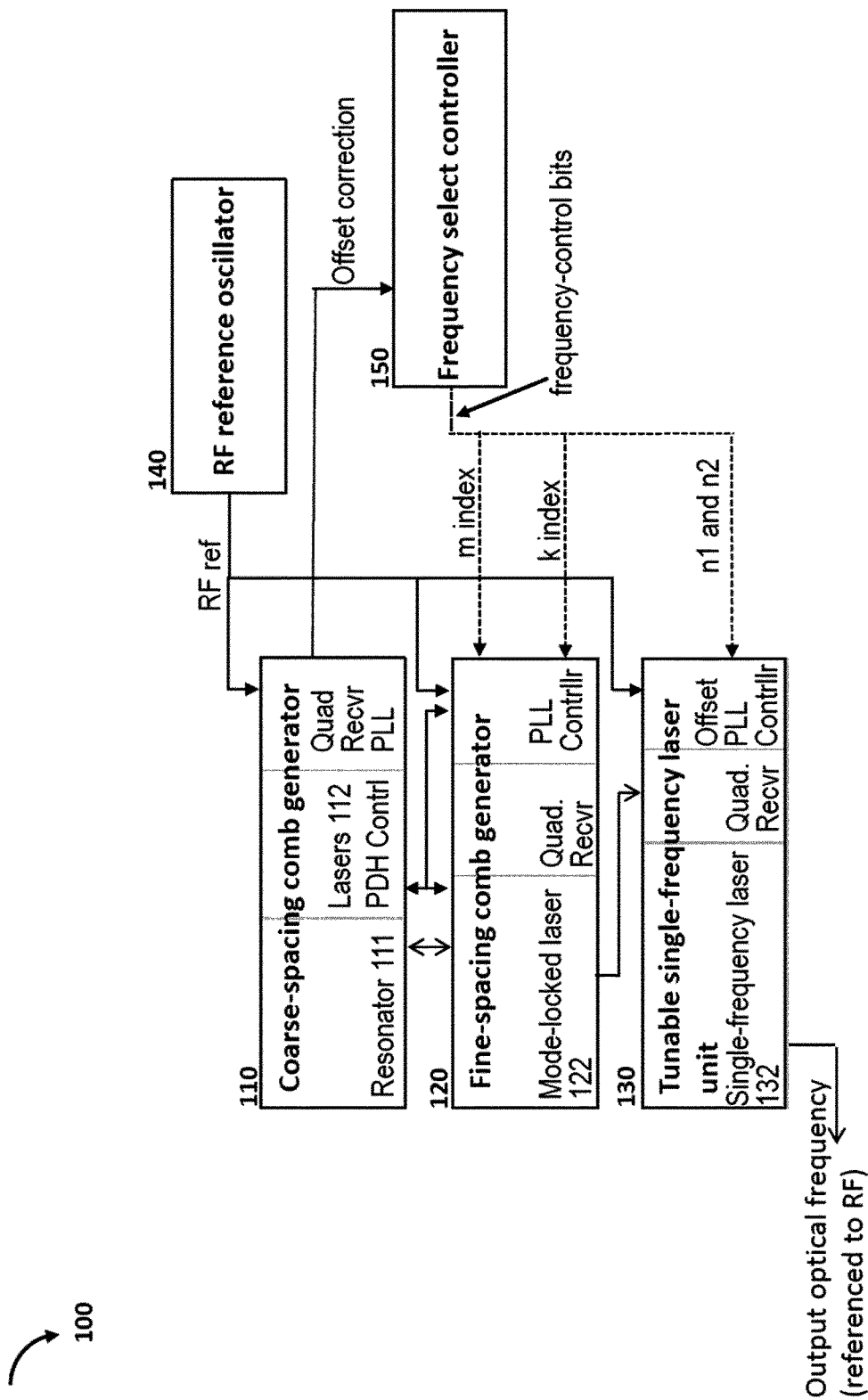
FIG. 1 illustrates an optical frequency synthesizer architecture according to an embodiment of the present disclosure.

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

A consideration of the present disclosure is to disclose several embodiments of an optical-frequency synthesizer that is compact in size, has lower power consumption, is programmable and has digitally specifiable output frequency of higher absolute precision and/or having a wider range of possible frequency values.

One technique to provide an optical frequency (OF) output having an absolute frequency value, is a mode-locked laser of a self-referenced type. To accomplish this self-referencing, with the aid of the precise frequency determination accomplished by an optical second-harmonic generation process, the OF comb produced from the mode-locked laser should have a span of at least one octave. The frequencies of combs having smaller span can be measured, and thus possibly controlled, by using two or more nonlinear optical processes, such as both second harmonic generation and sum frequency generation or third harmonic generation. These self-referencing mode-locked lasers have large size, with the size being greater than several thousand cubic cm.

One way to produce an output tone of variable optical frequency (OF) is to offset lock a tunable single-frequency laser to a mode-locked laser, which generates a comb of many frequencies. The output frequency of such a synthesizer can be scanned by locking the single-frequency laser to successive longitudinal modes of the stabilized mode-locked laser and also by varying the frequency offset of the phase locking. The frequency tuning is accomplished by changing the frequency of an RF signal that is supplied to an electronic circuit that controls the offset locking. This mode-locked laser, however, does not generate a sufficiently wide comb to become self-referenced so that absolute frequency values can be obtained, which requires a comb having octave span.

An approach for generating an absolute optical frequency is by locking lasers to an optical resonator comprising a vacuum cavity. An example of this technique is a mode-locked laser that is locked to two stable continuous-wave (CW) lasers, where the first comb line of this mode-locked laser (MLL) is phase-locked to a first CW laser and a second comb line of this MLL is phase-locked to a second CW laser. These two CW lasers are locked to the same optical vacuum-cavity resonator. Thus, the frequencies of the light produced by these two CW lasers have a defined relationship. These two CW lasers are selected to emit light of frequencies that are very different and that coincide with the outer edges of the frequency span of the comb produced by the MLL. By locking this mode-locked laser to two widely spaced frequencies defined by the vacuum resonator, both degrees of freedom for the MLL can be controlled. One phase-locked comb line fixes the carrier-envelope offset for the MLL comb and the other phase-locked comb line fixes the MLL comb spacing (or MLL pulse repetition rate). Here, a stable vacuum-cavity resonator was used to stabilize the frequency of the light produced by the laser locked to a mode (or comb line) of the resonator. Since a vacuum-cavity resonator has zero dispersion, with different frequencies of light having the same propagation constant or velocity, the absolute frequency of a given mode of the resonator can be known when the resonator free-spectral-range is kept stable. The frequency of a given resonator mode is a multiple of the resonator FSR. But the vacuum cavity based resonators are relatively big and not compact in size.

Another approach is to use an optical-waveguide resonator to stabilize the frequency of the light produced by a laser locked to a mode of that resonator. However, although the resonator-locked laser is stabilized and its output tone has narrow linewidth, the absolute frequency of that laser output is not established with high precision because the absolute frequencies of the waveguide-resonator modes are not known or controlled with high precision. Unlike a vacuum-cavity resonator, a waveguide resonator has non-zero dispersion and that dispersion also varies with the optical frequency. As a result, a dispersive resonator cannot define an absolute frequency.

An embodiment of the present disclosure discloses a novel way to account for the dispersion of its waveguide resonator. This embodiment provides a way to determine the absolute frequency of its waveguide-resonator modes by optically probing and thereby activating selected modes whose frequencies are far apart and by using a combination of optical second-harmonic generation and optical third-harmonic generation (e.g., via a mechanism involving second-harmonic generation and sum-frequency generation) to derive a measurable RF tone from those two widely spaced optical frequencies. Another embodiment of the present disclosure discloses the use of 2 or more lasers to activate and stabilize the comb associated with a dispersive optical resonator.

For an optical cavity comprising two ideal reflectors separated by vacuum, the frequencies of the comb lines (or resonator modes) are multiples of the free-spectral range of the resonator. There is no dispersion or frequency dependence of the speed of light in vacuum. Thus, the base or lowest frequency of the vacuum-resonator comb is zero. The main constraint for stabilizing the frequencies of the resonator comb involves mechanically and thermally stabilizing the optical cavity length and thus the resonator FSR. Only two lasers are needed to activate two lines of such a resonator comb, to measure the FSR of that comb. If the reference resonator were a vacuum cavity, the entire set of comb-line frequencies for that vacuum resonator could be stabilized by locking the frequency spacing between two modes of that resonator to a reference frequency. As stated earlier, the vacuum cavity based resonators are quite large in size.

A laser can have the frequency of its output light locked to a mode of an optical resonator. One can use lasers locked to resonator modes as a way to probe the frequencies of those resonator modes. This approach can be used to extract the frequencies of two modes of the reference vacuum cavity. If the frequency difference of two adjacent resonator modes is sufficiently low to be within the response bandwidth of a photo-detector, it may then be possible to lock that frequency difference to an RF reference. By using this kind of locking, it may be possible to compensate for variations that might induce a change in the resonator FSR by actively compensating for those changes and thereby stabilizing the resonator FSR. Use of a servo loop to lock one cavity resonator to another cavity resonator can also be done. Stabilized optical cavities generally are quite large, with even a compact optical cavity having a size that is approximately 100 cubic cm.

In an embodiment of this disclosure, the stabilization is accomplished by the reference resonator by locking the FSR of its modes to a frequency derived from the RF reference instead of depending entirely on constructing a mechanically and thermally stable structure. Thus, the reference resonator of this embodiment of the present disclosure can be compact and can have a size that is much smaller than 100 cm$^3$.

As discussed earlier, it is sufficient to probe two resonator modes to stabilize a vacuum cavity, which has zero dispersion. In contrast, the optical-waveguide resonators have non-zero dispersion. To solve this problem, another embodiment of the present disclosure discloses a method involving at least three lasers that probe the modes of the resonator. Two of these lasers have frequencies near the edges of a wide-spanning band of resonator-mode frequencies. The resonator is designed to have a dispersion relation that can be described by a single-valued, invertible relation between refractive index and frequency (or wavelength) in the range of frequency values within the wide span defined by the two lasers. The two lasers having frequencies near the edge of the wide span are used, in combination with optical second-harmonic generating and third-harmonic generating elements, to measure the dispersion of the waveguide resonator and to track any changes in that dispersion relation. This measured change is then used to adjust the value used for the offset locking of a laser in a subsequent stage of the cascade to the reference comb.

Yet another embodiment of the present disclosure discloses two lasers that have frequencies near comb lines spaced apart by only one or several resonator-mode intervals. In some embodiments, the relative dispersion is small or zero for frequencies near these closely spaced comb lines (refractive index remains approximately constant over that small span of frequency values). The two lasers with frequencies near these two comb lines are used to set the effective round-trip length (or the free spectral range) of the resonator. Essentially, the first of these two lasers is locked to a comb line and the second of these lasers probes and locks the comb FSR. Thus, the FSR control function tracks and adjusts for changes in the effective refractive index of the reference resonator and the dispersion tracking function accounts for changes in the slope of the refractive-index vs frequency (or wavelength) relation of the reference resonator.

Another novel feature of an embodiment of the present disclosure is the use of a fine-spacing comb (of a mode-locked laser or micro-resonator generator) to probe and control the FSR of a coarser-spacing comb (the semi-dormant comb of the reference resonator). Such a two-stage fine/coarse control scheme makes use of the unique capability of mode-locked lasers and of the cascaded four-wave mixing process to produce combs of very precise and uniform comb-line spacing. Thus, by controlling the spacing between two adjacent comb lines of the fine-spacing comb, one can also control the spacing between two comb lines of that fine-spacing comb that are much farther apart. Then, by locking one of those distant comb lines to a line of a coarser spacing comb, one can use the other distant comb line to control another line of the coarser spacing comb. This approach allows the reference resonator to have larger FSR and smaller overall length, and possibly larger loss per unit length. As a result, the reference resonator could be fabricated from a larger variety of materials and the disclosed synthesizer could be realized in a larger variety of optical wavelength ranges, such as the NIR, SWIR, MWIR or LWIR bands of wavelengths.

The current disclosure discloses several embodiments of optical-frequency synthesizers that have the combination of more compact size, lower power consumption, and provision of a programmable and digitally specified output frequency of higher absolute precision and/or having a wider range of possible frequency values. In contrast, devices that produce tunable optical tones of a specified frequency such as a single, frequency-tunable laser, a combination of a fixed-frequency laser and an optical single-tone (or single-sideband) modulator of tunable modulation frequency, and an optical-comb generator or mode-locked laser have serious drawbacks in size, efficiency and precision. To provide a precise absolute OF output, the single-frequency laser of an OF synthesizer is phase-locked to a stable optical reference cavity. The traditional optical reference resonators that might be used to stabilize these devices sufficiently to provide an absolute OF reference require large, bulky free-space or vacuum optical cavities. Alternatively, to provide absolute OF output, the mode-locked lasers of these devices can be configured to produce an octave-spanning comb and achieve self-referenced output frequencies with the assistance of an optical second-harmonic generator and a phase-locked loop to adjust the carrier-envelope offset of the comb. The mode-locked lasers capable of producing octave spanning combs have very high power consumption since those combs must have light in very many active comb lines and the light in a comb line must have sufficient intensity to be useable for phase locking. Likewise, very high optical pump power is needed to produce an octave spanning comb by four-wave mixing processes in these micro-resonators, again because the comb must have many active lines.

In contrast to the traditional OF synthesizers, several embodiments of the synthesizer disclosed in the present disclosure, contains an optical reference comb that can be formed on a chip, since this comb comprises the modes of an optical-waveguide resonator. Unlike resonators which have air-filled or vacuum cavities (i.e., with essentially zero dispersion), the resonators disclosed in the present disclosure are formed from an optical waveguide or other optical structure having engineered dispersion. The disclosed synthesizers of the present disclosure provide means to measure the dispersion characteristic of the reference comb and thereby estimate the value for a correction offset used to determine the absolute frequency of its output tone.

Furthermore, in contrast to requiring the mode-locked laser to produce and octave spanning comb, the mode-locked laser used in some embodiments of the present disclosure needs only to produce a comb whose span covers the FSR of the optical waveguide reference resonator (e.g., several hundred GHz). Thus, only a small number of comb lines need to be produced by the mode-locked laser and the power consumption of the laser can be comparatively low. Likewise, the micro-resonator generated comb in some embodiments of the present disclosure again only covers the FSR of the optical waveguide resonator. Thus, the optical pump power needed to generate that comb by four-wave mixing in the micro-resonator can be comparatively low. Although two additional single-frequency lasers may be used, in order to interrogate two other modes of the optical waveguide resonator, the output power of those two lasers are fairly low compared to the total output power of a mode-locked laser. In essence, although definition of a comb of wide span (either of octave, or 2×, span or at least of 1.5× span) is preferred in many embodiments of the present disclosure in order to achieve high accuracy in the absolute frequency value of the synthesizer output, that wide span is covered by a comb whose lines are mostly dormant, with only a few comb lines being active and actually having optical power. Such a semi-dormant comb applies the power only where it is most needed. Thus, the overall power consumption of the synthesizer of the present disclosure is greatly reduced.

This disclosure discloses several embodiments of an optical-frequency synthesizer that produces and outputs an optical frequency tone derived from phase-locking to a radio frequency (RF) tone provided as an input to the synthesizer from a RF reference source RF oscillator or RF synthesizer). Thus, the stability of the synthesized OF tone is related to the stability of the RF tone. The OF synthesizer establishes the absolute value of the optical frequency of its output tone by making use of a dispersive optical resonator. The OF synthesizer contains an optical reference resonator comprising a dielectric structure of engineered dispersion. The reference resonator defines a semi-dormant OF reference comb, wherein the lines of that reference comb are associated with the modes of the reference resonator. Several selected modes of this reference resonator are interrogated by locking the frequency of light emitted by lasers to those resonator modes. The few selected resonator modes are the active lines of this reference comb and the other lines of this comb remain dormant, until activated. Because the dispersion of the reference resonator is non-zero, and the effective refractive index or the group velocity of light varies with the frequency or wavelength of the light in the resonator structure, different pairs of adjacent resonator modes (and different pairs of adjacent comb lines) can have different frequency spacing (or wavelength spacing), unlike other OF synthesizers that use zero-dispersion vacuum-cavity resonators or use mode-locked lasers, both of which produce reference combs of uniform line-to-line spacing, to establish the absolute wavelength value of their outputs.

The disclosed OF synthesizer also contains a tunable single-frequency laser whose output light is electronically offset locked to a mode of the reference resonator or to a line of the comb produced by a mode-locked laser or by a micro-resonator comb generator. The optical output of the single-tone laser is the desired OF output of the synthesizer. The frequency of the output OF tone has a selectable offset from the frequency determined by a reference mode of the reference resonator, with that offset derived from the externally supplied RF tone. The frequency of the OF tone is selected according to the value of a digital control word.

Since the reference comb has non-uniform line-to-line spacing, the frequency value of the comb line associated with the reference mode cannot be determined solely by controlling the FSR associated with other resonator modes, especially those resonator modes that are spaced far from the reference mode. In several embodiments of the disclosed OF synthesizer in the present technology, the absolute frequency value of the reference mode is estimated by measuring the values of two widely spaced resonant frequencies of the optical reference resonator and establishing a frequency-correction value that is applied in determining the value of the locking offset for the output OF tone. To accomplish this estimation, a common base frequency can be defined that is a multiple of the frequencies of two widely spaced resonator modes. For example, that common base frequency may be 2× the frequency of a first resonator mode and also may be 3× the frequency of a second resonator mode. The difference or discrepancy between these 2× and 3× frequency values is evaluated by comparing it with a scale set by the RF reference to determine a frequency-correction value that can be considered in determining the digital control word. In some embodiments, the dependence of the effective refractive index of optical modes of the reference resonator structure on the frequency or wavelength of the light coupled to those modes can be described by a single-valued invertible function.

A selected pair of adjacent resonator modes of the reference resonator has the frequency (or wavelength) spacing between those modes set by phase locking that frequency (or wavelength) difference to a value derived from the RF reference. As a result, the effective refractive index of the resonator structure and the free-spectral-range (FSR) of the resonator at frequencies close to the frequencies of these two resonator modes can be set, typically by adjusting the local temperature or pressure of the reference resonator.

In some embodiments, the FSR of the reference resonator is sufficiently small that the frequency difference between two adjacent resonator modes can be detected by a photodetector of a phase locking circuit. In certain other embodiments, the FSR of the reference resonator is so large that the frequency difference between two adjacent resonator modes exceeds the maximum frequency response of a photodetector of a phase locking circuit. In some of these embodiments, the OF synthesizer also contains a mode-locked laser that produces an optical comb wherein two lines of the comb are used to interrogate and to control the frequency spacing between two modes of the reference resonator. In some of these embodiments of this disclosure, the OF synthesizer contains a micro-resonator comb generator that is pumped by a laser whose light also interrogates the reference resonator. Furthermore, another line of the comb produced as a result of cascaded four-wave mixing in the micro-resonator is used to interrogate the reference resonator. These two lines of the micro-resonator comb, the line associated with the pump light and a second comb-line, are used to control the frequency spacing between two modes of the reference resonator. The spacing between adjacent lines of the comb, produced by the mode-locked laser or by the micro-resonator comb generator, is stabilized by locking that frequency difference to a value derived from the RF reference. Since the comb line spacing is stabilized, to the RF reference, the FSR of the reference resonator also can be stabilized by adjusting the reference resonator so that the frequencies of the interrogated modes of the reference resonator and of the associated lines of the comb match each other.

The digital control word (alternatively called as frequency control word) specifies the reference-resonator mode offset value of the reference mode. The digital control word also can specify the line of the mode-locked laser or micro-resonator comb whose frequency is closest to the desired output frequency. The digital control word also specifies the frequency offset value used for offset locking the tunable single-frequency output laser. Finally, determination of the digital control word is affected by the frequency-correction value for the reference mode of the reference resonator.

In several embodiments of the present disclosure, OF synthesizer comprises a cascade of a semi-dormant reference comb and a tunable single-frequency laser that is offset-locked to a comb line derived from that semi-dormant reference comb. Selected lines of that semi-dormant reference comb are activated by interrogating the associated reference resonator with laser light at the frequencies of the resonator modes associated with those selected lines. The other, non-selected lines of the semi-dormant comb are not activated. In an exemplary embodiment, the reference comb is produced by a stage of the synthesizer comprising an optical resonator comprising a dielectric waveguide of engineered dispersion. This stage also comprises several single-frequency lasers that probe and thus activate selected lines of the semi-dormant comb, to convert those lines from being dormant to being active. Each laser is phase locked to a selected mode of the optical resonator, and thus a selected line of the reference comb. In one embodiment, a first laser is phase locked to a resonator mode and activates a comb line at a frequency $f_a$. A second laser is phase locked to another resonator mode and activates a comb line at a frequency $f_b$, wherein $f_b \approx 1.5 \times f_a$. In an embodiment, a third laser is phase locked to a resonator mode and activates a comb line at a frequency $f_m$. In this embodiment, a fourth laser is phase locked to another resonator mode and activates an adjacent comb line at a frequency $f_{m+1}$, wherein $f_{m+1} - f_m$ is approximately the free-spectral range of the resonator. In another embodiment, a selected tone of a mode-locked laser in a subsequent stage of the cascade is phase locked to a resonator mode and activates a comb line at a frequency $f_m$. In this embodiment, another selected tone of the mode-locked laser is phase locked to another resonator mode and activates an adjacent comb line at a frequency $f_{m+1}$, wherein $f_{m+1} - f_m$ is approximately the free-spectral range of the resonator. In yet another embodiment, a third laser of a subsequent stage is phase locked to a resonator mode and activates a reference-comb line at a frequency $f_m$, and the output of the third laser also is coupled to a micro-resonator and generates a micro-resonator comb by means of cascaded four-wave mixing or other non-linear optical processes. In this embodiment, a line of the comb generated by the micro-resonator is phase locked to another reference resonator mode and activates an adjacent reference-comb line at a frequency $f_{m+1}$, wherein $f_{m+1} - f_m$ is approximately the free-spectral range of the reference resonator. In an embodiment, a fifth laser is phase locked to a reference resonator mode and activates a comb line at a frequency $f_k$.

In an embodiment, the comb line at a frequency $f_a$ and the comb line at a frequency $f_b$, wherein $f_b \approx 1.5 \times f_a$, are used to determine an offset-frequency correction that can compensate for the frequency or wavelength dependent variation of the propagation constant or the effective velocity of light in the reference-comb defining resonator. Light at frequency $f_a$ from the first laser is coupled to an optical $3^{rd}$ harmonic generator that produces light a frequency $3 \times f_a$. Light at frequency $f_b$ from the second laser is coupled to an optical $2^{nd}$ harmonic generator that produces light at a frequency $2 \times f_b$. The dispersion of the reference resonator is engineered such that $2 \times f_b = 3 \times f_a + f_c$. The offset-frequency correction value $f_c$ can be combined with the optional frequency offset value $f_o$ used in frequency-offset phase locking the tunable output laser to a selected line at a frequency $f_k$ of the resonator-defined semi-dormant comb. The values of the frequency offset $f_o$ and of the selected line at frequency $f_k$ are specified by the digital control word. In an embodiment, the frequency difference $f_{m+1} - f_m$, is maintained by phase locking that frequency difference to the external RF reference. In some embodiments, the frequency $f_k$ can be identical to the frequency $f_{m+1}$ or the frequency $f_m$ of the resonator-defined comb.

In an exemplary embodiment, the synthesizer comprises a cascade of a mode-locked laser or a micro-resonator comb generator and a single-tone producing laser. The mode-locked laser or micro-resonator comb generator produces an optical comb having a uniform tone-to-tone spacing (i.e., the spacing between adjacent comb lines). The spacing between the tones of the comb is set by phase-locking a selected pair of those tones to the external RF reference. Also, the frequency of at least one tone of the comb is set by locking that tone to a selected line of the semi-dormant comb, such as the line at frequency $f_k$ or the line at frequency $f_m$ or $f_{m+1}$. The single-tone laser produces an optical tone that can then be offset locked to a selected tone produced by the mode-locked laser or micro-resonator comb generator by means of a frequency-offset phase locking loop. This phase locking loop determines the difference between the frequencies of the selected tone from the comb and the tone from the single-tone laser and locks that difference to the RF reference, with an optional frequency offset. The value of the frequency offset between these two tones is specified by the digital control word. Also, the selected tone of the comb produced by the mode-locked laser or micro-resonator comb generator is specified by the digital control word.

In some embodiments, the presently disclosed OF synthesizer also can comprise a nesting of multiple combs that have different free spectral range. For example, a first comb of very wide span (e.g., 2× or 1.5× span in optical frequency) suitable for establishing an absolute frequency value can have large FSR (e.g., ≥200-500 GHz) and a second comb whose FSR is sufficiently small (e.g., ≤10 GHz) to be detected by common photo-detectors can have relatively small span (with that span only being equal to or slightly greater than the FSR of the wide spanning comb). Since the two nested combs are locked to each other, with the finer comb also controlling the spacing of the coarser comb, and since the tone spacing of the finer comb can be electronically detected and controlled, the tone spacing or comb-line spacing for both combs can be controlled with great precision by locking to an RF reference tone.

FIG. 1 illustrates an architectural block diagram of an embodiment 100 of the optical-frequency (OF) synthesizer. The synthesizer produces a continuous-wave (CW), single-frequency optical output whose frequency is specified by an electronic frequency-select controller 150 and whose stability is determined by a radio-frequency (RF) reference oscillator 140. The synthesizer comprises a coarse-spacing comb generator 110 comprising an optical-waveguide resonator 111, which defines a primary reference comb, a fine-spacing comb generator 120 comprising a mode-locked laser 122, which generates a secondary reference comb, and a tunable output laser unit 130 comprising a single-frequency laser 132. The primary reference comb, the secondary reference comb and the tunable, single-frequency output tone are the basic functional products of this synthesizer embodiment. The primary reference comb has a comb-line spacing that is relatively coarse and the secondary reference comb has comb-line spacing that is finer. Two selected lines of the secondary reference comb are phase-locked to two selected lines of the primary reference comb. The single-frequency laser 132 is phase locked to a comb-line of the secondary reference comb with a frequency offset and produces the output of the synthesizer.

The comb-line spacing between two selected lines of the primary reference comb (or the frequency spacing between the two associated modes of the optical-waveguide resonator) is held fixed, to a frequency value determined by the RF reference oscillator 140. For this embodiment of the OF synthesizer, the frequency spacing between a selected pair of adjacent resonator modes or comb lines, and thus the free spectral range (FSR) of the primary resonator 111, exceeds the frequency response bandwidth of the photo-detector in the phase-locking circuit that controls the FSR of the primary reference resonator. In order to enable the FSR of the primary reference resonator to be measured and controlled, those two selected resonator modes are probed by two non-adjacent comb lines of the secondary OF comb, produced by the mode-locked laser 122, whose FSR is much smaller than the FSR of the primary comb. The FSR, or equivalently the difference between the frequencies of adjacent comb-lines, of the secondary comb has a sufficiently small value that it is within the frequency-response bandwidth of the photo-detector and the phase-locking circuit.

The light of two selected adjacent comb lines of the secondary comb are coupled to a photo-detector that produces an RF output whose frequency is the difference between the frequencies of those two optical comb lines. In essence, the photo-detector heterodynes the two optical tones with the difference frequency being a result of that heterodyning. That difference frequency, after some division, is compared with the frequency of the RF reference, produced by oscillator 140, to obtain an error-correction signal used to stabilize the FSR. The Frequency Select Controller 150 provides the frequency control bits, which are divided into portions: m index, k index and n1 and n2, as explained in FIG. 3.

Figure 2:
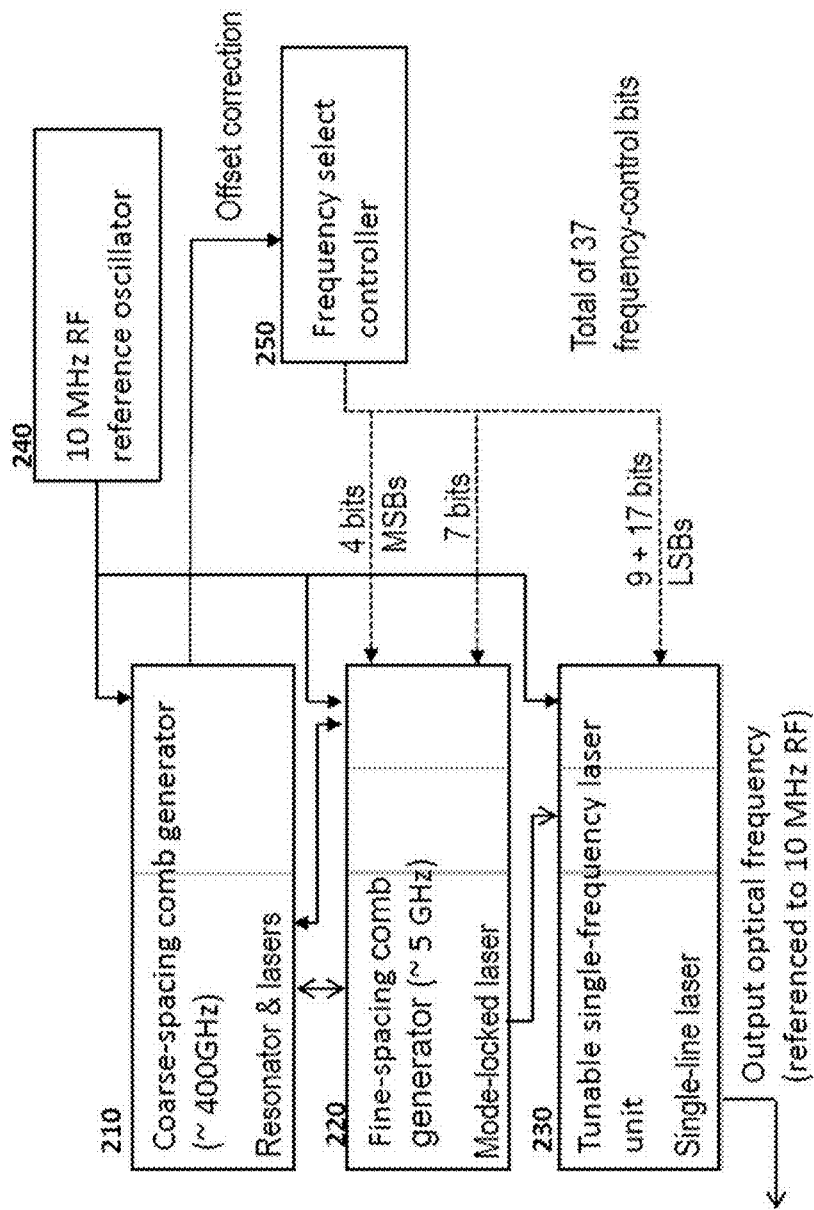
FIG. 2 illustrates an example implementation of the optical frequency synthesizer in FIG. 1 according to an embodiment of the present disclosure.

FIG. 2 illustrates an embodiment 200 according to the architecture of FIG. 1. In this embodiment, the coarse—spacing comb generator 210 defines a comb (comb 1) that has a comb spacing of 400 GHz and has a reference span of 80 THz. In this embodiment 200, the Frequency Select Controller 250 has 37 bits in the frequency control word. Four most significant bits (MSB) of the frequency control word provide the offset number or index "m" of the comb line from the beginning of the reference comb window. The coarse-spacing comb generator 210 comprises a reference resonator 211, lasers 212, a 2H/3H corrector and Pound-Drever-Hall (PDH) controllers. The fine-spacing comb generator 220 comprises a Mode Locked Laser (MLL), a quadrature receiver 224 and a phase-locking loop (PLL) controller 225. The Reference RF Oscillator 240 in this embodiment provides a 10 MHz RF reference. The MLL locks to the resonator line of comb-1 selected by the "m" index portion of the frequency control word. Comb-2 is the fine-spacing or secondary comb from the Fine-spacing Comb Generator 220 and has at least 80 comb lines at 5 GHz spacing. The frequencies of this fine comb and can be shifted to cover a 6 THz output span, as determined by the "m" index. The Frequency Control Word (FCW) provides the "k" index and the output laser 230 locks to the "$k^{th}$" comb line of comb-2. The values "n1" and "n2" of the frequency control word further define, with greater precision, the output frequency of the OF synthesizer as described in FIG. 3.

Figure 3:
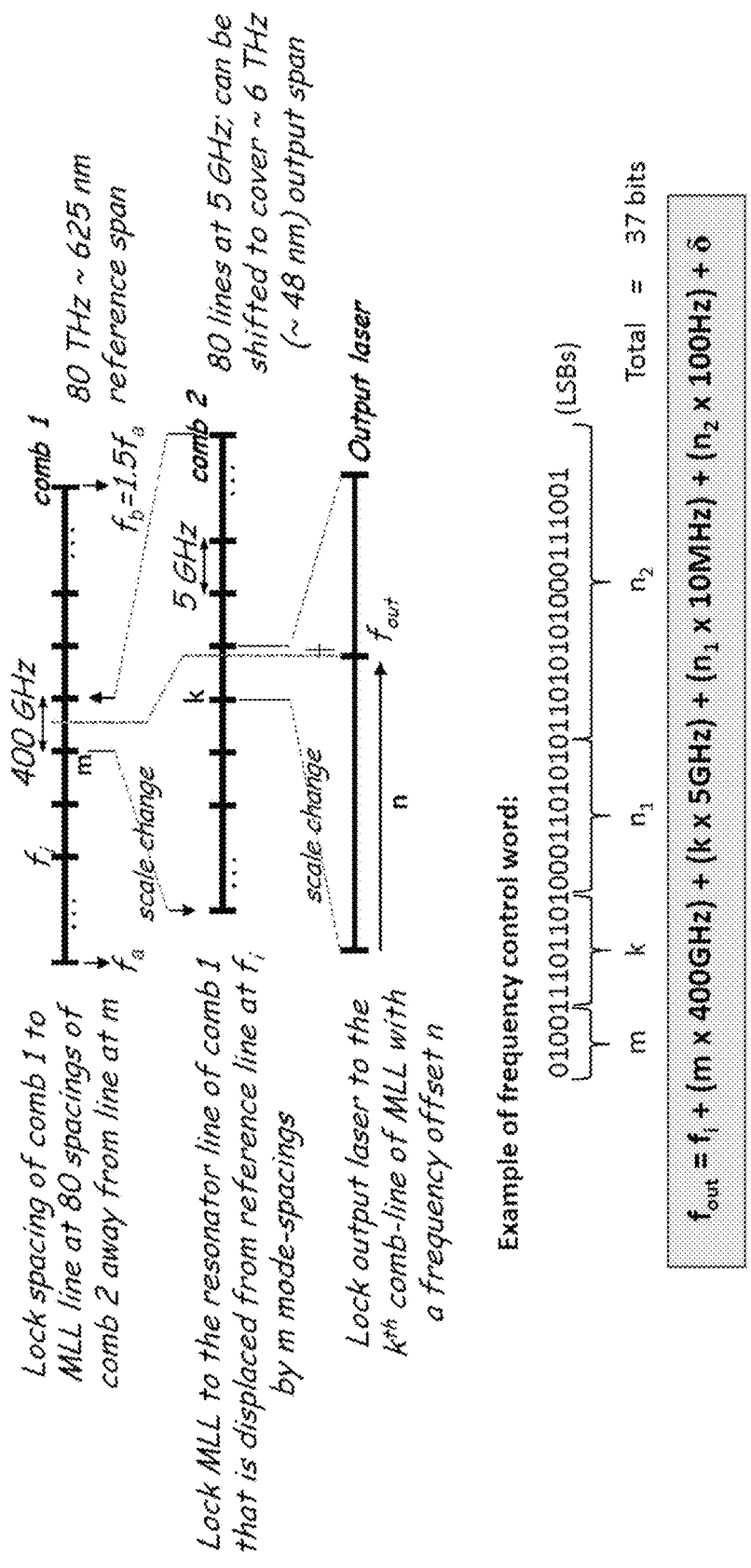
FIG. 3 illustrates a sample programmable process for determining the synthesized output frequency using a digital control word for the system illustrated in FIG. 2. according to an embodiment of the present disclosure.

FIG. 3 illustrates an example of the frequency alignment of the two reference combs. For this example, the FSR of the primary comb is 400 GHz and the FSR of the secondary comb is 5 GHz as illustrated in FIG. 2. Two lines of the secondary comb that have a frequency spacing of approximately 400 GHz are aligned with two selected adjacent lines of the primary comb. The light of these two selected distantly spaced lines of the secondary comb is coupled into the primary resonator and that light probes the associated modes of the primary reference resonator. The mode-locked laser, which generates the secondary comb, can have its gain spectrum tuned, by changing the pump current supplied to its amplification stage, and also can have its effective laser-cavity length tuned, by changing the voltage supplied to its intra-cavity phase shifter. In one embodiment, the mode-locked laser pump current can be adjusted to align a first line of the mode-locked laser's two distantly spaced lines to a first selected line of the primary comb. Then a parameter that affects the effective round-trip time or path length of the primary reference resonator is adjusted to align the second line of the mode-locked laser's two distantly spaced lines and the second selected line of the primary comb. In this way, the comb spacing of the mode-locked laser actually is controlling the comb spacing of the primary reference resonator.

The FSR of the primary comb is a multiple of the FSR of the secondary comb. In the present example, the FSR of the primary comb is 80 times the FSR of the secondary comb. The mode-locked laser is configured to produce a comb that has at least 80 lines. The frequency spacing between the comb-lines of the mode-locked laser is uniform and is equal to the repetition rate of the optical pulses produced by the mode-locked laser. That frequency spacing is chosen to be sufficiently small (e.g., 5 GHz) that the optical heterodyne beat note or the frequency difference between adjacent comb lines is within the frequency response bandwidth of an optoelectronic phase locking circuit. The frequency spacing can be adjusted by adjusting the voltage supplied to the phase shifter in the laser.

The mode-locked laser and the secondary comb it produces essentially serves as an optical "gear" that transforms the wide (e.g., 400 GHz) comb line spacing of the primary reference resonator into a sufficiently narrow (e.g., 5 GHz) comb line spacing that can be electronically detected and controlled. The optoelectronic phase-locking control circuit compares the photo-detector produced heterodyne signal with the RF reference. Any deviation between the frequency of the heterodyne signal, which can be further divided electronically to approximately the frequency of the RF reference, and the RF reference frequency produces an error signal that is used to adjust either the primary comb or the secondary comb. In one embodiment, this error signal is used to control the frequency spacing of the mode-locked laser comb. In another embodiment, this error signal is used to control the frequency spacing between two adjacent modes of the reference-resonator comb.

In this example, some of the lines of the primary reference comb act as reference points for frequency aligning the secondary comb generator, which in this case is the mode-locked laser comb generator. The comb-lines of the secondary reference comb, produced by the mode-locked laser, act as reference points for the single-frequency, tunable output laser. To produce a range of output frequencies that cover a frequency span exceeding the spacing between adjacent lines of the primary comb, other pairs of adjacent primary-comb lines could be selected for locking with the secondary comb. The secondary comb can be shifted, in frequency, to whichever pair of primary comb lines is selected, according to the value of the "m" index in the frequency control word. That general translation of the secondary comb can be accomplished by tuning the gain-spectrum of the mode-locked laser. For typical semiconductor mode-locked lasers, the gain spectrum can be shifted by hundreds of GHz to several THz, or more, by a combination of temperature tuning and current tuning of the gain stage in those lasers.

The single-frequency output laser is phase-locked, with a specified frequency offset, to a selected line of the mode-locked laser comb generator, according to the value of the "k" index in the frequency control word. As the mode-locked laser comb is shifted to coincide with different pairs of lines of the primary comb, the gain spectrum of the single-frequency output laser also can be tuned to shift along with the mode-locked laser. A combination of temperature tuning and current tuning can be used to shift the frequency coverage of the output laser. Fine-tuning of the output frequency, which is controlled by an optoelectronic offset locking circuit, can generally be accomplished by current tuning of the output laser.

As an example, we assume the values of the optical frequency output can vary between 188 THz and 194 THz, covering a 6 THz span. The corresponding free-space wavelengths range from ~1600 nm to ~1550 nm, a 50 nm wide span that covers portions of the C-band and the L-band of optical telecommunications wavelengths. The comb line at 188 THz is the $470^{th}$ resonator mode and the comb line at 194 THz is the $485^{th}$ resonator mode, for the 400 GHz spaced primary reference comb. That comb line spacing is held fixed as different pairs of adjacent primary-comb lines are selected.

In some embodiments, the primary reference resonator comprises a structure (such as an optical waveguide) whose dispersion characteristic, or the dependence of the effective refractive index of the structure for light propagating in that structure on the frequency or wavelength of that light, can be described by a single-valued, invertible function over a range of frequencies (or wavelengths). In general, the value of the effective refractive index would increase as the frequency of the light increases (or as the wavelength of the light decreases). In a desired embodiment, the resonator structure is designed to have an engineered dispersion characteristic such that the dispersion is close to zero (i.e., constant value for the effective refractive index) over the span of frequencies that must be produced by the synthesizer, which can be called the output span. Also, the dispersion characteristic can be described by a single-valued, invertible function over a reference span that encompasses the output span and that has a low-frequency point and a high-frequency point, for which the frequency value of the high-frequency point is 1.5 times greater than the frequency value of the low-frequency point.

The frequency select controller 250 of the synthesizer defines a frequency control word, which in some embodiments can be chosen by a user of the synthesizer. The frequency control word comprises digital numbers that indicate the offset of the desired output frequency $f_{out}$, from a pre-determined absolute reference frequency $f_i$. The reference frequency $f_i$ lies within the reference span. In some embodiments, the reference frequency $f_i$ is located at one edge, such as the low-frequency edge, of the output span. In this case, the frequency control word would be a positive number. In some embodiments, the frequency control word comprises 3 parts. These parts specify numbers S and n that specify the frequency offset between $f_{out}$ and $f_i$. The number n defined as $n=f_{out}-f_i-S$. Also, n can be further divided into "n1" and "n2". For example, as in FIG. 3, "n1" can be multiples of 10 MHz and "n2" can be multiples of 100 Hz. In this case, $n=[(n1)\times10\text{ MHz}]+[(n2)\times100\text{ Hz}]$. Essentially, S represents the coarse offset and n represents the fine offset in the frequency translation from the reference frequency value to the desired output frequency value. The number S specifies the frequency offset in units of the secondary comb spacing and can be divided into two parts. A first part is a number "m" that specifies the frequency offset or index, in units of the primary comb spacing, between $f_{out}$ and $f_i$. A second sub-part is a number "k" that equals $S-(m\times H)$, where H is the number of secondary comb spacing values within one primary comb spacing. For example, H=80 when the primary comb spacing is 400 GHz and the secondary comb spacing is 5 GHz.

The number "m" selects a line of the primary reference comb, of frequency $f_m$, to which the secondary reference comb is aligned. The number "k" selects a line of the secondary reference comb to which the output laser is locked, with a frequency offset given by the value n. Ideally, the frequency $f_m+k\times FSR_2$ (wherein $FSR_2$ is the secondary comb spacing) should have a value that is n smaller than $f_{out}$. However, because the primary reference resonator has non-zero dispersion, $f_m k\times FSR_2$ may not equal $f_{out}-n$. Thus, the frequency control word is modified by an offset-frequency correction value δ given by the difference between $f_m+k\times FSR_2$ and $f_{out}-n$.

As an aid to further illustrate the function of the frequency control word, the table in FIG. 5 lists a set of frequency offset values that are binary multiples of 10 MHz or for which 10 MHz is a multiple. We assume for this example that the RF oscillator supplies a 10 MHz reference signal to the optical synthesizer. We also assume that the desired optical output has a frequency that can be defined with a resolution finer than 100 Hz. The values shown in the table in FIG. 5 can represent the offset of the output frequency $f_{out}$ from the reference frequency $f_i$. The values in this table also can be used to determine a binary frequency control word associated with an absolute frequency $f_{out}$ of the synthesizer output.

As indicated by the table in FIG. 5, a frequency specification number of 41-bit or 49-bit length is needed to specify the absolute frequency value to a precision of <100 Hz or <1 Hz, respectively. To specify a frequency offset with <100 Hz precision within an output span of 6 THz requires a binary frequency control word having at least 35-bit length. In some embodiments, the frequency control word comprises several segments of shorter bit-length.

With reference to FIG. 3, in an exemplary embodiment, the m most significant bits of the frequency control word are used to select a particular comb line of the primary reference comb. That comb line is chosen because its frequency is closest to and lower than the desired output frequency of the synthesizer, when compared to the other lines of the reference comb. The next k most significant bits of the frequency control word are used to select a particular comb line of the secondary reference comb produced by the mode-locked laser. That comb line is chosen because its frequency is closest to and lower than the desired output frequency of the synthesizer, when compared to the other lines of the mode-locked-laser produced comb. The next n bits of the frequency control word are used to determine the frequency offset for locking the frequency of the single-tone laser to the selected line of the mode-locked laser comb. The four binary values—m, k, n1 and n2—define increasing finer aspects of the OF offset $f_{out}-f_i$ between the reference frequency and the synthesizer output frequency.

The reference frequency $f_i$ can lie anywhere within the span of possible output frequencies generated by the synthesizer, or could even be outside that span. In an exemplary embodiment, the reference frequency $f_i$ is selected to be the lowest frequency of the span of possible output frequencies generated by the synthesizer. In this case, the frequency offset between this reference frequency and the desired output frequency $f_{out}$ is a positive number.

The following example illustrates an embodiment for which the synthesizer has an output span of 6 THz and a primary comb spacing of 400 GHz. In this case, m=4 bits (to select one of 15 possible primary comb lines). The secondary comb has at least 80 possible lines, to cover the 400 GHz primary comb spacing with lines spaced 5 GHz apart. Thus, k=7 bits. In an exemplary embodiment, for which the RF reference has a frequency of 10 MHz, the portion of the frequency control word that controls the offset locking is separated into two parts. The first part, n1, has 9 bits to specify a frequency offset with a maximum value of 5 GHz at an increment of 10 MHz. The second part, n2, has 17 bits to specify a frequency offset with a maximum value of 10 MHz at an increment of 100 Hz. In such embodiments, the offset correction value that is used to determine the frequency control word likewise may have two parts, with these parts producing an offset correction that has a frequency resolution of 10 MHz or 100 Hz. In some embodiments, the offset correction values are combined in the frequency select controller circuit with the offset locking specification values to produce the actual frequency reference values used for phase-locking the single-frequency laser to the selected line of the mode-locked laser.

The required tuning or adjustment range for the comb-line spacing of the mode-locked laser comb can be small compared to the value of that comb-line spacing and that tuning is used just to maintain lock of that spacing to a number derived from the RF reference. Likewise, the required tuning or adjustment range for the comb-line spacing of the primary reference comb can be small compared to the value of that comb-line spacing and is used just to maintain lock of that spacing to a pre-determined multiple of the comb-line spacing of the mode-locked laser comb. Because the comb-line spacing of the two combs have values that change over only a small range, both the primary reference resonator and the resonator of the mode-locked laser can have the round-trip time interval for light propagating in them changed with an optical phase shifter or phase modulator in the resonator (see FIG. 8), which produces only a small change in the effective velocity of the light, rather than requiring a physical displacement of an intra-resonator component to accomplish a change in the resonator length. For the mode-locked laser, this round-trip interval is the pulse-to-pulse time-interval of the light generated by fundamental mode-locking. In some embodiments, the mode-locked laser is operated in its fundamental mode-locking regime. Thus, only one pulse is resident in that optical resonator at a given instance in time. In other embodiments, the laser can be operated in a low-harmonic mode-locking regime and several pulses of light can be resident in its optical resonator at a given instance.

Figure 6:
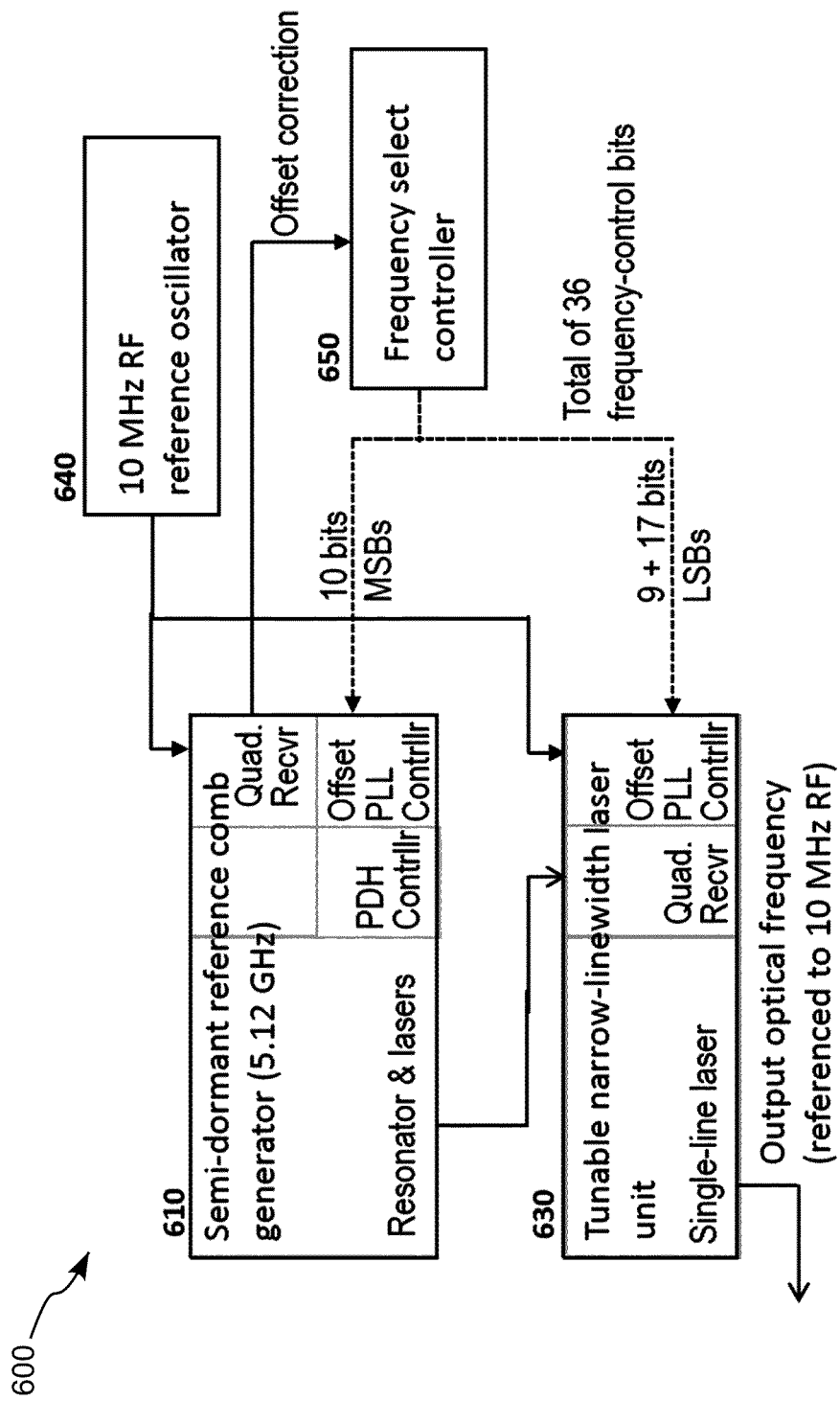
FIG. 6 illustrates an example implementation of the optical frequency synthesizer architecture in FIG. 4 according to an embodiment of the present disclosure.

FIG. 6 illustrates a block diagram of another OF synthesizer architecture 400, an embodiment of the present disclosure. In this architecture 400, a semi-dormant reference comb generator 410 comprises a reference resonator 411 that produces a reference comb to which the tunable single-frequency laser unit 430 is phase locked with a specified frequency offset. The reference comb generator 410 comprises lasers, PDH controllers, Quadrature Receivers and a PLL Controllers. The RF Reference Oscillator 440 provides the RF reference to both the units 410 and 430. A Frequency Select Controller Unit 450 provides the Frequency Control Word (FCW). The "k" index, which comprises the most significant bits (MSB) of the FCW is provided to unit 410 to select the appropriate comb line from the reference comb. The selected comb line from the reference comb is coupled to the unit 430. The unit 450 also provides the finer frequency adjustments n1 and n2 as part of the FCW to unit 430. The Tunable Narrow-line Width Laser Unit 430 comprises a Single-line Laser, a Quadrature Receiver and an Offset PLL Controller.

The workings of this architecture 500 can be explained in terms of an exemplary embodiment 600 shown in FIG. 6. The Frequency Synthesizer 600 comprises of a Semi-dormant reference comb generator 610, a Tunable narrow-linewidth Laser 630, a RF Reference Oscillator Unit 640 and the Frequency Select Controller 650. For this example, the comb line spacing, or frequency difference, of the reference comb of unit 610 is within the frequency response bandwidth of the photo-detector and electronic locking circuit. The RF reference from the RF Reference Oscillator 640 to which the OF synthesizer 600 is locked is assumed to produce a stable 10 MHz RF tone. The example shown has a comb line spacing of 5.12 GHz. We assume that the photo-detector and the electronic locking circuit has a response bandwidth exceeding 5.12 GHz. For this example, we assume the output span of the synthesizer is approximately 3 THz and covers optical frequencies between 191.0 THz (~1569.59 nm) and 194.0 THz (~1545.32 nm).

Figure 7:
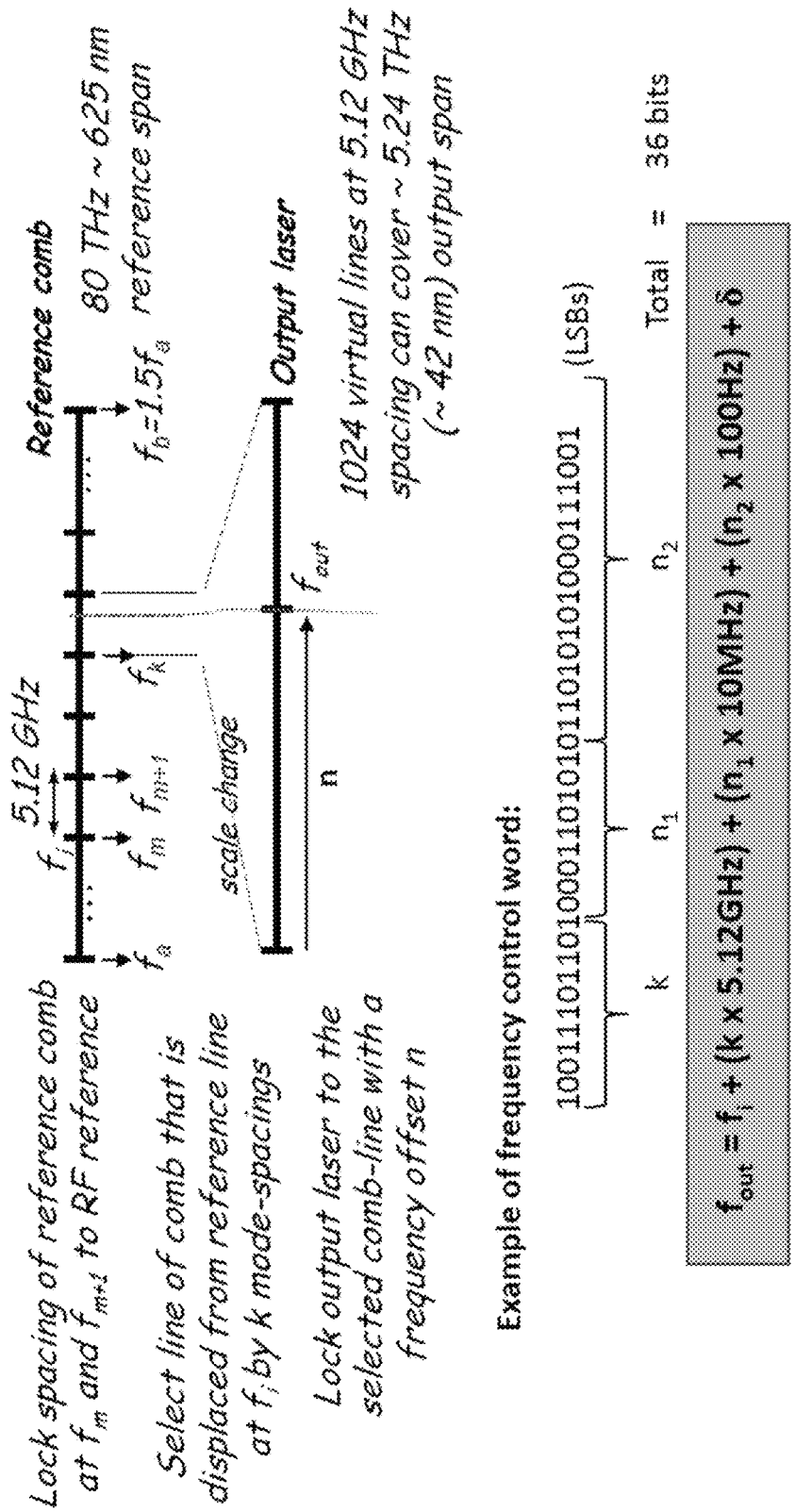
FIG. 7 illustrates a sample programmable process for determining the synthesized output frequency using a digital control word for the system illustrated in FIG. 5. according to an embodiment of the present disclosure.

FIG. 7 illustrates how the frequency control word from the Frequency Select Controller 650 specifies the desired output frequency $f_{out}$ of the synthesizer 600. We assume the reference frequency $f_i$ is 191.0 THz, the lowest frequency of the output span. The "k" index, which comprises the first 10 bits of the frequency control word, selects a particular comb-line of the reference comb whose frequency $f_k$ is closest to and lower than the desired output frequency of the synthesizer. The next 9 bits of the frequency control word specifies $n_1$, which determines a coarse offset for the offset locking with an increment of 10 MHz. Another 18 bits of the frequency control word specifies $n_2$, which determines a fine offset for the offset locking with an increment of 100 Hz. An offset correction value is supplied to the frequency select controller circuit and is used by that controller to determine the frequency control word.

The reference comb is semi-dormant, with only several of its comb lines activated by being probed by laser light. A first probe laser that has an OF approximately equal to the absolute frequency $f_m$ of the reference comb line is phase locked to the reference resonator mode associated with the selected comb line. A second probe laser has an OF that is 5.12 GHz higher than the frequency of the first probe laser and is phase locked to the resonator mode of the adjacent comb line of frequency $f_{m+1}$ on the higher frequency side of the selected comb line. The light from both the first probe laser and the second probe laser are coupled to an optical-heterodyne phase locking circuit for which the RF reference provides a reference waveform. That phase locking circuit maintains the frequency difference between the two probe lasers to the desired value of 5.12 GHz, with a stability given by the RF reference. A Pound-Drever-Hall (PDH) phase locking technique, with the light from the first laser coupled to an optical phase modulator and then to the reference resonator, is used to adjust the first probe laser so that it remains locked to the selected line of the reference resonator. The gain spectrum and phase shift of the first probe laser can be adjusted to maintain this lock. The gain spectrum and phase shift of the second probe laser can be adjusted to maintain the 5.12 GHz offset phase locking between the two probe lasers. Finally, another PDH phase-locking circuit, with the light from the first laser coupled to an optical phase modulator and then to the reference resonator the temperature of the reference resonator, is used to maintain the phase locking between the second probe laser and the reference resonator. The temperature of the reference resonator can be adjusted to maintain this phase locking.

If we consider the temperature dependence for the refractive index of the reference waveguide resonator as being roughly $10^{-5}$ per ° C., a 100° C. change in resonator temperature would produce a relative shift of $10^{-3}$ in the frequency of an activated line of the reference comb. Since the frequency of the activated line is around 190-195 THz, such a relative shift would correspond to a change in the frequency of around 200 GHz. The example described with regard to FIG. 2 has a spacing of 400 GHz between the comb lines of the primary comb and represents a prudent design that ensures individual resonator modes would remain distinguishable despite the temperature-induced frequency shift. The example described with regard to FIG. 5, with a spacing of only 5.12 GHz between its reference-comb lines, would require the global temperature variation of the reference resonator to be less than 2° C. Also, the local temperature of the reference resonator would need to be tunable with sufficient resolution to accomplish the desired phase locking.

In some embodiments, a third probe laser at frequency $f_k$ is selected by the frequency control word. A Pound-Drever-Hall (PDH) phase locking technique, with the light from the third laser coupled to an optical phase modulator and then to the reference resonator, is used to adjust the third probe laser so that it remains locked to the selected line of the reference resonator. The gain spectrum and phase shift of the third probe laser can be adjusted to maintain this lock. The output laser is phase locked to this third probe laser with a frequency offset that also is determined by the frequency control word.

As illustrated in FIG. 3 and FIG. 7, two other probe lasers are coupled to the reference resonator. The frequencies $f_a$ and $f_b$ of these other probe lasers are set to two widely spaced lines of the reference comb. As an example, $f_a \approx 160.00$ THz (1.875 μm wavelength) and $f_b \approx 240.00$ THz (~1.25 μm wavelength). These two frequencies were chosen because compact semiconductor lasers emitting light at these frequencies can be achieved. Also, their common multiple, $2 \times f_b \approx 480$ THz and $3 \times f_a \approx 480$ THz (~0.625 μm wavelength) is another frequency for which compact semiconductor lasers can be achieved.

If the reference resonator has zero dispersion and the effective refractive index of the light propagating in that resonator has the same value for all frequencies between $f_b$ and $f_a$, those two frequencies also would be exact multiples of 5.12 GHz, the comb line spacing. For example, 160.000 THz would be the frequency of the 31,250$^{th}$ line of a comb of 5.12 GHz spacing that starts at 0 Hz and 240.000 THz would be the 46,875$^{th}$ line of that comb. Also, the 37,305$^{th}$ comb line would have a frequency of 191.0016 THz and the 37,891$^{st}$ comb line would have a frequency of 194.00192 THz.

Figure 8:
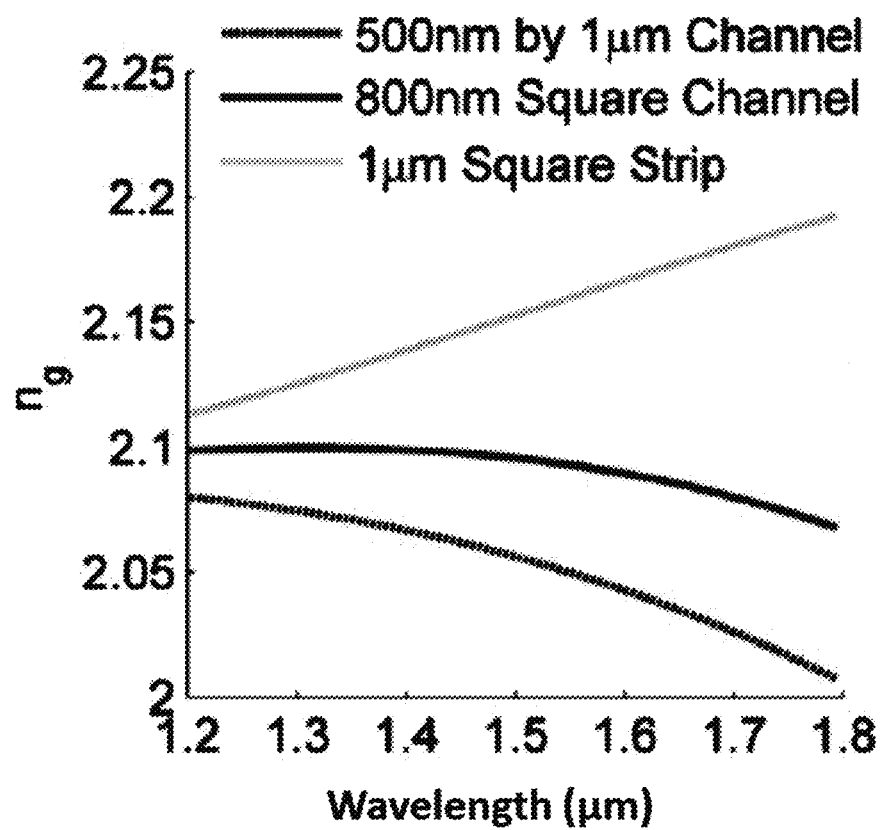
FIG. 8 illustrates examples of effective refractive-index dependence of optical waveguide structures on wavelength of light.

The dispersion characteristic (or the dependence of the effective refractive index with wavelength) of the light propagating in the reference resonator is preferably engineered to be describable by a single-valued invertible function. For most transparent materials, the material refractive index decreases with wavelength. The group velocity $v_g$ of the light is inversely proportional to the effect refractive index $n_{eff}$. The dispersion is the change in group velocity with frequency. For most transparent materials, the group velocity decreases for increasing optical frequency and that material is considered to have "normal" dispersion rather than having "anomalous" dispersion. Dispersion causes the comb-line spacing to be different for different pairs of adjacent lines of the reference comb. Fluctuations such as in the local temperature of the reference resonator or from other noise sources can change the value of the effective refractive index and also the value of the dispersion for each frequency value. The effective refractive index of the optical waveguide also depends on the dimensions and shape of the waveguide and the polarization of the light. FIG. 8 illustrates an example of the dependence of the effective index for silicon nitride waveguides on the wavelength of the light. The slope of the index vs wavelength relation can be positive or negative, depending on the waveguide design.

The waveguide dispersion is often discussed as a wavelength-dependent dispersion parameter $D_\lambda$ that is described by the following relation:

$$D_\lambda = -\frac{2\pi c}{\lambda^2}\frac{\partial^2 k}{\partial \omega^2}; k = \frac{2\pi}{\lambda}n_{eff}; \omega = 2\pi f$$

Figure 9B:
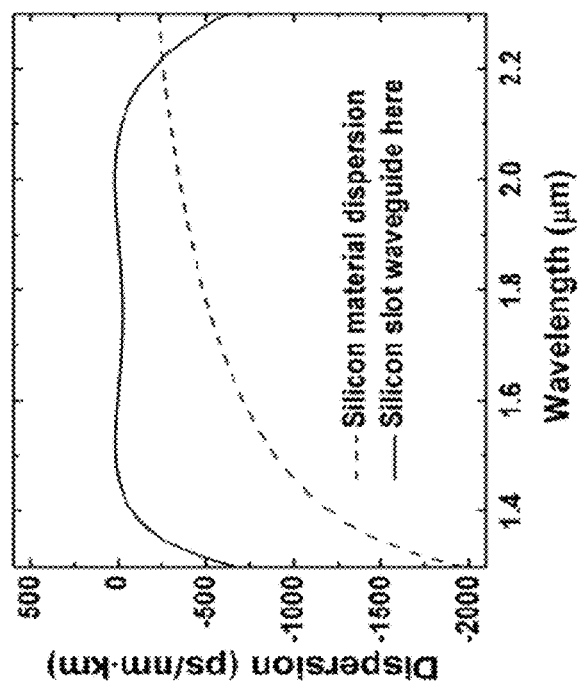
FIGS. 9a and 9b illustrate examples of wavelength dependent dispersion parameter on wavelength of light for silicon Nitride based optical waveguide structures and for silicon slot waveguides.
Figure 9A:
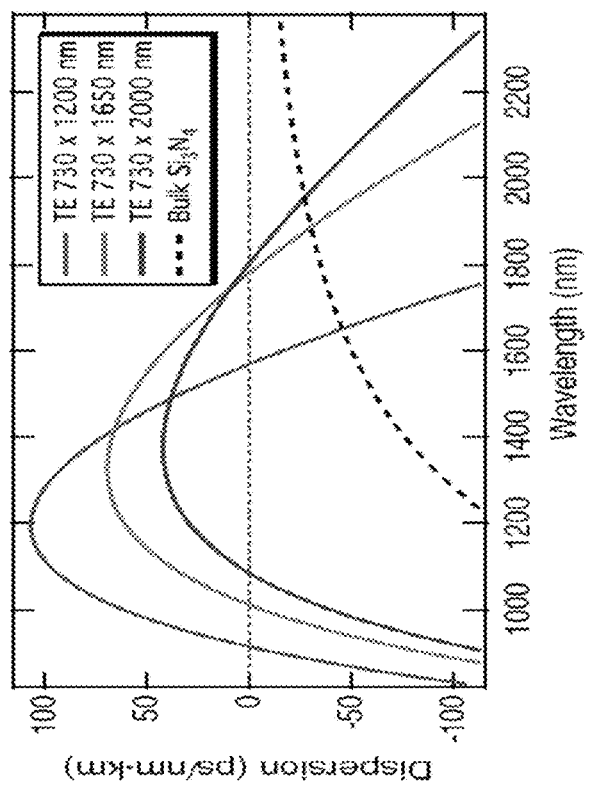
Figure 10A:
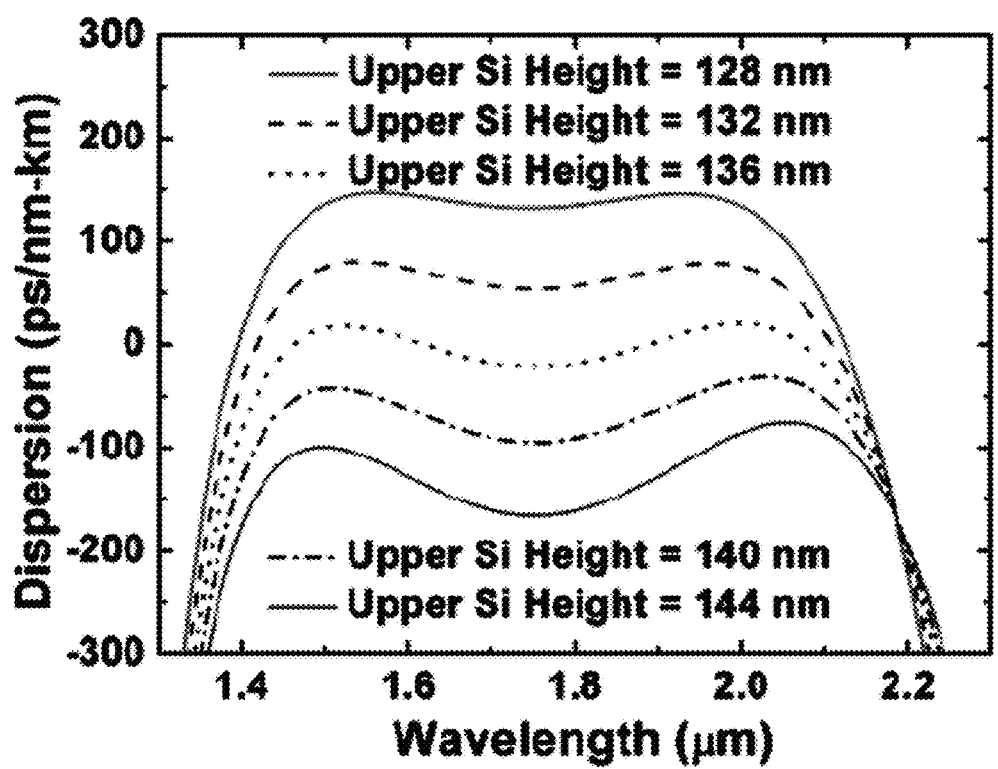
FIGS. 10a and 10b illustrate examples of wavelength dependent parameter of optical waveguides and its dependence on waveguide geometry.
Figure 10B:
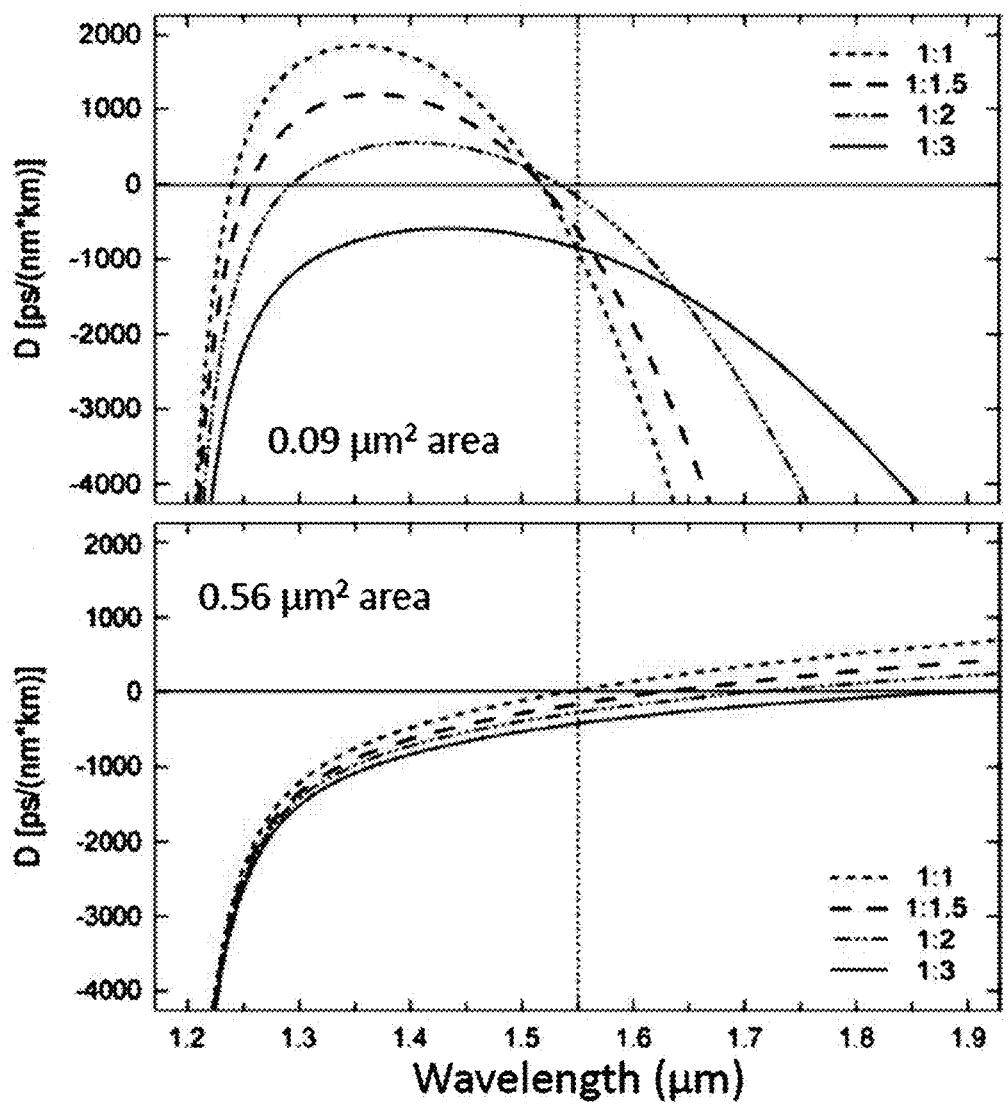

The wavenumber k depends on frequency (or wavelength) also because the effective index $n_{\it{eff}}$ is frequency dependent. The wavelength-dependent dispersion parameter generally is negative, as illustrated in FIG. 9a and FIG. 9b, for silicon nitride and silicon materials, respectively. The waveguide of the reference resonator can be engineered to achieve values for wavelength-dependent dispersion parameter that are close to zero over the span of output wavelengths (or frequencies) produced by the synthesizer and that also remain negative over the entire reference span. As a result, the relation between the effective index and wavelength (or frequency) can be a single-valued invertible function. This engineering of the waveguide dispersion can be accomplished by adjusting the width and height of the waveguide core material, such as silicon or silicon nitride, and the refractive index of the waveguide cladding material, such as air or silicon dioxide. FIG. 9a and FIGS. 10a and 10b show examples of the dependence of the wavelength-dependent waveguide dispersion on the dimensions of the waveguide core for waveguides that have an oxide slot in silicon (FIG. 10a), a silicon strip buried in oxide (FIG. 10b) and a silicon nitride strip buried in oxide (FIG. 9a).

In an exemplary illustration, we assume that only the value of the effective refractive index and the value of the slope of the effective-index variation with frequency can change. The locking of the resonator FSR at the frequencies $f_m$ and $f_{m+1}$ resets the value of the effective index at those particular frequencies (or more precisely at the mid-point between those two frequencies). The values of the effective index and thus the comb-line spacing between other pair of comb lines in the output span as well as the absolute values of those comb lines are still affected by a change in the slope of the effective-index variation with frequency. This change in the slope of the effective-index variation with frequency is estimated by evaluating the difference between $2 \times f_b$ and $3 \times f_a$. Knowledge of the slope of the effective-index variation with frequency (or wavelength) allows one to estimate the value of the effective index for other modes of the reference resonator that are spaced away from the two modes controlled by the phase locking.

It is desirable to engineer the dispersion of the waveguide resonator such that there is no slippage in the resonator mode numbers over the entire output span. For example, we assume the output span is 4 THz and extends from 190.800 THz (1571.24 nm wavelength) to 194.800 THz (1538.98 nm wavelength). The comb line at 190.800 THz is associated with the $38,160^{th}$ mode of the reference resonator, for a resonator set for 5 GHz FSR. The comb line at 194.800 THz is associated with the $38,960^{th}$ mode of that resonator. The dispersion should be sufficiently small that the change in effective index over the output span of 4 THz (or 32.26 nm) is only $1.25 \times 10^{-3}$. As a result, it is possible to set the frequency spacing of any pair of adjacent comb lines to 5 GHz and the resonator mode number associated with any other comb line within the output span could still be determined unambiguously. For another example having the same output span, we assume the resonator FSR is 400 GHz. The comb line at 190.800 THz would be associated with the $477^{th}$ mode of the resonator and the comb line at 194.800 THz would be the $487^{th}$ mode of that resonator. In this case, the dispersion could produce a change in the effective index of almost 10% and the comb lines within the output span still could be determined unambiguously.

The values for wavelength dispersion given in the examples shown in FIGS. 8, 9a, 9b, 10a and 10b are on the order of 100 to 1,000 picoseconds per nm of wavelength span per km of waveguide through which the light propagates. Consider the exemplary values for $f_a \approx 160.00$ THz (1.875 μm wavelength) and $f_b \approx 240.00$ THz (~1.25 μm wavelength) given previously that represent a span of 80 THz (~625 nm wavelength). Also, consider a resonator having a FSR of 5 GHz (or 400 GHz). Assuming the effective index has a value of 2.0, the round-trip length of the resonator would be 3 cm (or 0.375 mm). The dispersion of this resonator waveguide should be sufficiently small that the difference in round-trip times for $f_a$ and $f_b$ should be less than one cycle at the FSR of 5 GHz (or 400 GHz). This constraint requires the wavelength dispersion parameter to be smaller than 10,000 psec/nm·km in order to have the comb lines over this large frequency span still be associated with unique resonator modes.

The silicon nitride and silicon dioxide materials (or the silicon and silicon dioxide materials) comprising a waveguide resonator have some dispersion. Also, the waveguide itself has dispersion because the light at a first wavelength will have a first ratio between the overlap of its optical-field distribution with the silicon nitride portion and with the silicon dioxide portion of the waveguide. But the light at a second wavelength will have a different, second ratio between the overlap of its optical-field distribution with the silicon nitride portion and with the silicon dioxide portion of the waveguide. Since the refractive index of the silicon nitride material is different from the refractive index of the silicon dioxide material, the net "effective refractive index" of the light of a given wavelength or frequency will be different from the net "effective refractive index" of the light of another wavelength or frequency. The silicon-nitride and silicon-dioxide waveguide structure of the resonator can be designed such that the dispersion of its guided light, for a particular waveguide mode, can be described by a single-valued invertible function. An example of such a function is a linear increase in the "effective refractive index" as the wavelength is decreased (or as the frequency of the light is increased).

The modes of the reference resonator at the frequencies of $f_m$ and $f_{m+1}$ are probed, by locking (using the PDH technique) other lasers to those resonator modes, and are used to set and stabilize the resonator free-spectral range (FSR). The FSR is essentially stabilized at a frequency that is the average of $f_m$ and $f_{m+1}$, typically by adjusting the value of the material index (e.g., by changing the temperature) so that the effective refractive index of the waveguide produces the desired FSR. A result of the waveguide dispersion is that for light of another frequency $f_k \neq f_m, f_{m+1}$, the frequency $f_k$ of a laser that is locked to the resonator is not exactly equal to a multiple of the free-spectral range established by the phase-locking of the $f_m, f_{m+1}$ light (i.e., $f_k \neq N_k \times FSR_{m,m+1}$, where $N_k$ is the mode number of the resonator mode at frequency $f_k$). Dispersion curves such as those illustrated in FIGS. 8, 9a, 9b, 10a and 10b can be used to estimate the departure or frequency offset δ of $f_k$ from $N_k \times FSR_{m,m+1}$. These characteristic curves provide a way to estimate the absolute frequency value of activated comb frequency $f_k$, to which the synthesizer output will be locked.

By setting the "effective refractive index" of the light at frequency $f_c = 0.5(f_m + f_{m+1})$ we can obtain an estimate of the "effective refractive index" of the light at frequency $f_k$, with high accuracy since the dispersion is a single-valued invertible function. This is especially true if we also have knowledge of the dispersion characteristic or the slope of the effective index to frequency (or wavelength) relation in that range of frequencies. Setting the resonator FSR essentially sets the value for the effective index at $f_m$ and $f_{m+1}$. The slope of the effective-index to frequency relation can be estimated by probing lines of the reference comb that are far apart such as the lines at $f_a$ and $f_b$. The frequency separation between $f_a$ and $f_b$ essentially determines the accuracy with which that slope can be measured.

It is important to account for the slope of the dispersion characteristic if the dispersion characteristic has a large slope (i.e., if the magnitude of the wavelength dispersion is large). Consider a case in which the frequency difference between $f_m$ and $f_{m+1}$ is large and the output frequency has a value between those two frequencies. In some embodiments, the output laser (132 or 232 respectively) is offset locked to the comb line at $f_m$ or to a line of the secondary comb that is locked to $f_m$. But that frequency $f_m$ is different from the frequency $f_c=0.5(f_m+f_{m+1})$ determined solely by controlling the FSR of the resonator. Likewise, it is also important to account for the slope of the dispersion characteristic if the frequency difference between $f_k$ and $f_c=0.5(f_m+f_{m+1})$ is large and the output laser is offset locked to $f_k$. The large frequency difference between $f_a$ and $f_b$ used to estimate the slope of the dispersion characteristic means that estimate is done with high accuracy.

A way to measure the "effective refractive index" of the light at a frequency $f_a$ is to use a non-linear optical resonator to obtain light at frequency $2 \times f_a$ by second harmonic generation (SHG). The light at frequency $f_{2a}$ and the light frequency $2 \times f_a$ can be coupled to a quadrature receiver to obtain an RF signal that equals the difference between those two optical frequencies. First, we assume frequency $f_b$ has the value $N_a \times FSR_{m,m+1}$, with $FSR_{m,m+1}$ having a precise value determined by the RF reference. Also, we assume that the absolute value of frequency $f_a$ can be estimated with sufficient accuracy that we can establish the value for the mode number $N_a$. This means the any change in $f_a$ due to environmental factors such as temperature or pressure or stress is sufficiently small that $f_a$ will remain clearly distinguishable from $f_{a-1}$ and $f_{a+1}$. For example, we assume $f_a$ is approximately equal to the ITU (International Telecommunication Union) grid frequency value 187.40 THz (in the L-band). We also assume, for this example, that $FSR_{m,m+1} \approx 200$ GHz. In this case, $N_a=937$ and the laser at frequency $f_a$ activates the $937^{th}$ line of the reference comb. The second harmonic generator produces a tone whose frequency is $2 \times f_a=374.80$ THz. A second laser at frequency $f_{2a}$ activates the $1874^{th}$ line ($N_{2a}=1874$) of the reference comb. This comb line has a frequency $f_{2a}$, which can be different from 374.80 THz since the waveguide resonator has non-zero dispersion. The frequency difference between $f_{2a}$ and $N_{2a} \times FSR_{m,m+1}$ is in the microwave domain and can be measured by the phase/frequency detector and frequency counter in the phase-locking electronics. Assume, for example, the waveguide resonator has a linear relation between the "effective refractive index" at the resonator-mode frequency and the resonator-mode number that is described as $n_{eff,2a}=A(N_{2a}-N_a)+n_{eff,a}$, at least for frequencies between, $f_a$ and $f_{2a}$. The measured difference between $f_{2a}$ and $N_{2a} \times FSR_{m,m+1}$ can provide a measure of the slope-factor A. Now, the phase-lock loop controlled comb-line spacing $FSR_{m,m+1}$ depends on the group velocity of the light at frequencies $f_m$ and $f_{m+1}$, or actually at $f_c=0.5(f_m+f_{m+1})$. Thus, by knowing the value of the slope-factor A, we can then determine the value of the absolute frequency $f_a$ (corresponding to the $937^{th}$ mode reference resonator) with greater precision, since $FSR_{m,m+1}$ is measured and controlled precisely and since $n_{eff,a}=A(N_a-N_m)+n_{eff,m}$. Similarly, for the activated comb line at $f_k$, that frequency is offset from the value $N_k \times FSR_{m,m+1}$ by an offset-correction value $\delta$, as given by the expression $\delta=A(N_k-N_m)(c/L)$, wherein c is the speed of light in vacuum and L is the length of the reference resonator. For a waveguide whose dispersion characteristic is described by a different relation, the offset $\delta$ can be obtained from another expression derived from that relation.

In practice, it may be difficult to design and fabricate a waveguide structure whose dispersion characteristic is sufficiently linear over an octave frequency span. A smaller, half-octave span can be used by defining frequencies $f_b$ and $f_a$ such that $f_b=1.5 \times f_a$, and $2 \times f_b=3 \times f_a$. We then can use the frequencies $f_{2b}=2 \times f_b$ and $f_{3a}=3 \times f_a$ that are produced by second harmonic generation (SHG) and by third harmonic generation (THG), respectively, to estimate the slope of the dispersion curve. When there is zero dispersion, $f_{2b}=f_{3a}$. When the dispersion is linear, having a constant slope for the span of frequencies between $f_b$ and $f_a$, the difference between $f_{2b}$ and $f_{3a}$ can be measured to estimate the slope A. For example, we assume that $f_m$ and $f_{m+1}$ are located approximately half-way between $f_b$ and $f_a$. Then $n_{eff,b}-n_{eff,a}=A(N_b-N_a)$. In practical applications of the synthesizer, environmental conditions such as temperature, pressure or stress my cause the effective refractive index dispersion characteristic to shift in magnitude or be translated along the frequency axis or even to change its tilt (or slope). The control of the reference resonator FSR and adjust the value of the effective refractive index. The measurement of the slope A accomplished by evaluating allows one to account for changes in the slope and for translations along the frequency axis. When the dispersion curve for the waveguide of the reference resonator is not sufficiently linear, it may be helpful to measure the dispersion characteristic and to analyze it by simulations and models.

In some embodiments, the synthesizer has a look-up table that contains values for the offset correction to be used in the locking of the tunable output laser to the selected line of the reference comb. The offset correction depends on the parameter in (or in some embodiments the parameter k), which selects the line of the reference comb to which the output laser is locked and on the measured frequency difference $2 \times f_b - 3 \times f_a$. One way to establish the values of the offset correction table is to first characterize the reference resonator under various conditions of temperature and other factors by measuring the frequency difference $2 \times f_b - 3 \times f_a$ obtained for different pairs of comb lines set to have the desired spacing, such as of 5.12 GHz (i.e., for different values of m where $f_{m+1}-f_m=5.12$ GHz). Also, the absolute value $f_m$ (or in some embodiments for $f_k$) is measured under these same conditions. The desired frequency offset correction value can be determined by evaluating the departure of the measured frequency $f_m$ (or $f_k$) from its desired value of $(m \times 5.12 \text{ GHz})+f_i$. The frequency $f_i$ is assumed to be at the low-frequency end of the output span. For a given value of the parameter m, different values of the measurement $2 \times f_b - 3 \times f_a$ will give different values of the correction obtained from evaluating $f_m-(m \times 5.12 \text{ GHz})+f_i$.

Figure 11:
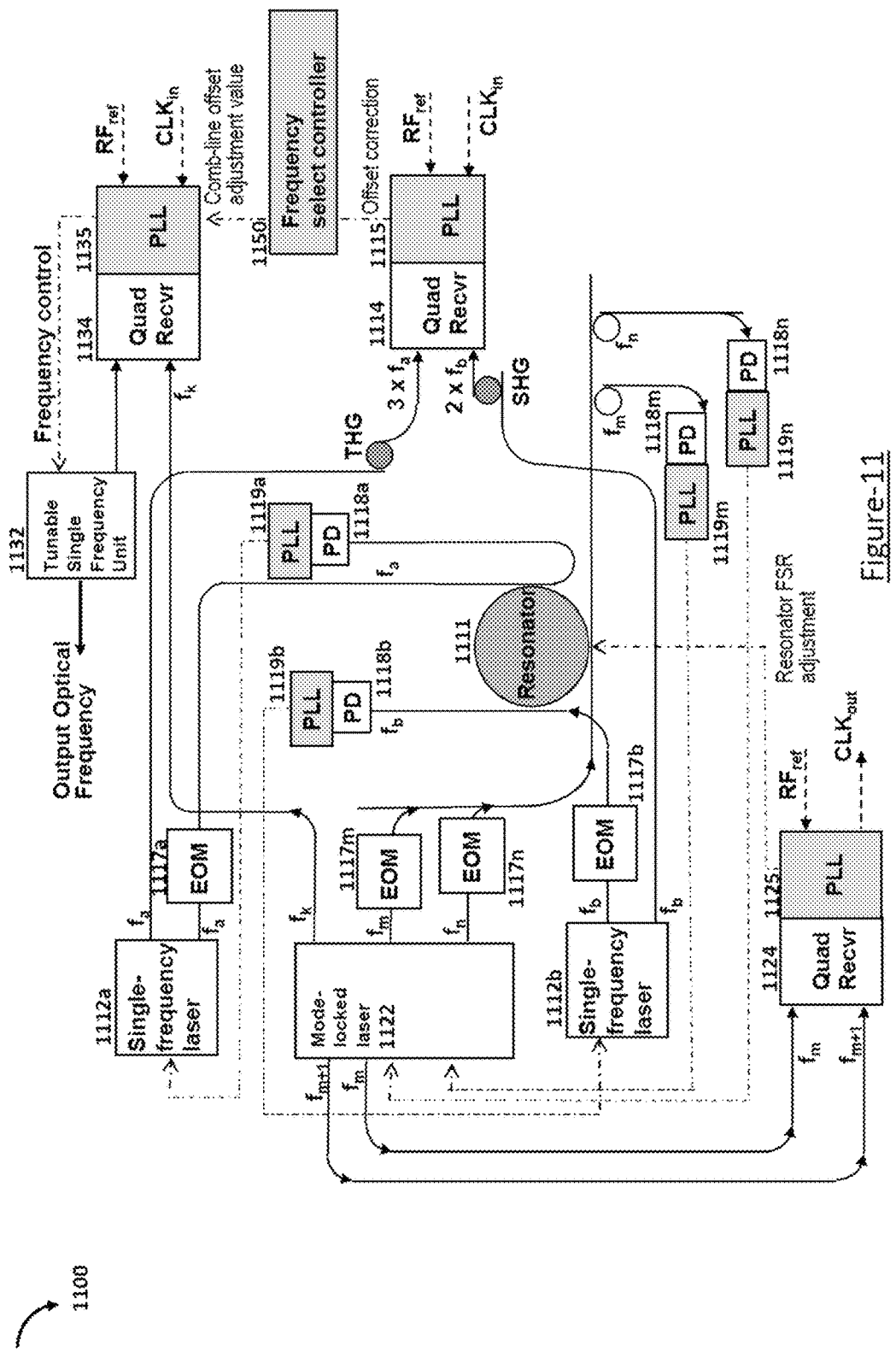
FIG. 11 illustrates component details inside of a coarse-spacing comb generator and its interfaces to other units of the optical frequency synthesizer module architecture illustrated in FIG. 1, according to an embodiment of the present disclosure.

The system 1100 illustrated in FIG. 11 provides some details about the components inside of an OF Synthesizer, according to an embodiment of the present disclosure. It particularly details the course-spacing comb generator unit of the synthesizer and its interfaces. The course comb generating unit comprising a resonator 1111, single frequency lasers 1112a and 1112b that activate the coarse-spacing comb lines at $f_a$ and $f_b$, a quadrature receiver 1114, and phase-locking loop (PLL) circuit 1115. The OF synthesizer also includes a fine-spacing comb generator unit that comprises a mode locked laser 1122 with output couplers 1123m, 1123n and 1123k. The mode locked laser interface to a quadrature receiver 1124, which interfaces to a PLL circuit

1125. The tunable single frequency laser unit of the synthesizer comprises an output single line laser 1132, a quadrature receiver 1134 and an offset PLL controller 1135. The system 1100 also illustrates interfaces between the various units in this embodiment, including the RF reference oscillator, which provides the RF reference signal $RF_{ref}$, and the frequency select controller 1150.

FIG. 11, illustrates component details of the OF synthesizer architecture embodiment 100 of FIG. 1. The optical-waveguide resonator 1111 has four of its resonant modes "activated" by locking lasers to those modes. The modes with resonant frequencies at $f_m$ and $f_n$ are activated by light from the mode-locked laser 1122 through couplers 1123*m* and 1123*n*. The mode at resonant frequency $f_a$ is activated by light from laser 1112*a*. The mode at resonant frequency $f_b$ is activated by light from laser 1112*b*. The remaining modes are "dormant" since no optical power is associated with those dormant modes and thus those modes do not contribute to the overall power consumption of the OF synthesizer.

FIG. 11 illustrates a resonator 1111 that has three taps made to it. A first tap is used to couple light of two different frequencies $f_m$ and $f_n$ to/from the resonator. A second tap is used to couple light to/from the resonator whose frequency $f_a$ is at the low-frequency (longer wavelength) end of the semi-dormant comb. A third tap is used to couple light whose frequency $f_b$ is approximately 1.5 times greater than the frequency $f_a$. The frequency $f_b$ is at the high-frequency (shorter wavelength) end of the semi-dormant comb. The frequencies $f_m$ and $f_n$ are near the center of the semi-dormant comb. These three sets of frequencies are chosen to be relatively far apart. Thus, the first tap is essentially not noticed by the frequencies of light coupled by the second tap or by the third tap. The second tap is not noticed by the frequencies of light coupled by the first tap and the third tap. And, the third tap is not noticed by the frequencies of light coupled by the first tap and the second tap. As a result, the Q of the resonator can remain high for a given frequency, without being degraded by the presence of the additional taps.

In some embodiments, each frequency of light coupled into the resonator is emitted by a different laser or laser line that is phase-locked to the corresponding "activated" mode of the resonator by means of the Pound-Drever-Hall (PDH) phase-locking method. According to the PDH method, the laser emitted light is phase modulated, such as by an electro-optic modulator (EOM), to produce sideband frequencies that are displaced from the frequency of the laser-emitted light by a value that is greater than the linewidth of a resonator mode. The laser is adjusted so that its emitted frequency approximately coincides with a resonator mode. That aser-emitted light is coupled into the resonator, via a feed waveguide, but the light at the modulation-produced sideband frequencies is not coupled into the resonator (since they lie far outside the resonator-mode linewidth). The light transmitted through the feed waveguide includes components at the two sideband frequencies as well as a component at the laser-emitted frequency that comprises some light not coupled into the resonator and some light coupled back out from the resonator. In general, the coupling between the feed waveguide and the resonator is designed to be in the critically coupled regime or in the over-coupled regime, such that more power is coupled into the resonator than is lost in the resonator (or coupled out through the other taps).

As depicted in FIG. 11, the output of single-frequency laser 1112*a*, is divided into two parts; one part is coupled to the resonator tap for frequency $f_a$ through a PDH module that includes a EOM 1117*a*, a photodetector (PD) 1118*a*, and a phase locking loop (PLL) circuit 1119*a*. This PDH module acts to lock the light from laser 1112*a* to the resonator mode at frequency $f_a$. A second part of the output of laser 1112*a* is coupled to a third-harmonic generator (THG) that could be made from a material such as periodically poled lithium niobate (PPLN). The THG produces light of frequency $f_{3a}$. The output of another single-frequency laser 1112*b*, is divided into two parts; one part is coupled to the resonator tap for frequency $f_b$ through a PDH module that includes a EOM 1117*b*, a photodetector (PD) 1118*b*, and a phase locking loop (PLL) circuit 1119*b*. This PDH module acts to lock the light from laser 1112*b* to the resonator mode at frequency $f_b$. A second part of the output of laser 1112*b* is coupled to a second-harmonic generator (SHG) that could be made from a material such as periodically poled lithium niobate (PPLN). The SHG produces light of frequency $f_{2b}$. The output light from the THG and the SHG, at frequencies $f_{3a}$ and $f_{2b}$, is coupled to a quadrature receiver 1114, which is coupled to a phase locking circuit 1115. This phase locking circuit determines the offset correction value that is used by the frequency select controller 1150 to adjust for variations in the slope of the dispersion characteristic.

The tap for the frequencies of $f_m$ and $f_n$ is used to set and stabilize the free-spectral range (FSR) of the resonator. Some of the light at the frequency $f_m$ and at the frequency $f_{m+1}$ produced by the mode-locked laser 1122 are Coupled into an optoelectronic receiver 1124 connected to phase-locking electronics 1125 that stabilize the reference-resonator free-spectral range or the frequency spacing between adjacent resonator modes. This adjustment can be done, for example, by changing the temperature of the resonator material. For an exemplary waveguide resonator made from silicon nitride and silicon dioxide materials, those materials have a temperature dependence of their refractive index that is on the order of $10^{-5}$ per degree-C. Considering that the FSR is 400 GHz, in one example, a 1 degree-C change in temperature experienced by the entire resonator would change the FSR by 4 MHz. An FSR change of 100 Hz would involve a change in temperature over the entire resonator of only 25 micro-degrees. Another way to achieve a small change of the resonator FSR is to change the temperature of only a small portion of the overall resonator. For another example, such as the one illustrated in FIG. 12, the resonator FSR is approximately 5 GHz. In this case, a 1 degree-C change in temperature of the resonator would change the resonator FSR by 50 kHz, and a 2 milli-degree change in temperature would change the resonator FSR by 100 Hz.

Figure 12:
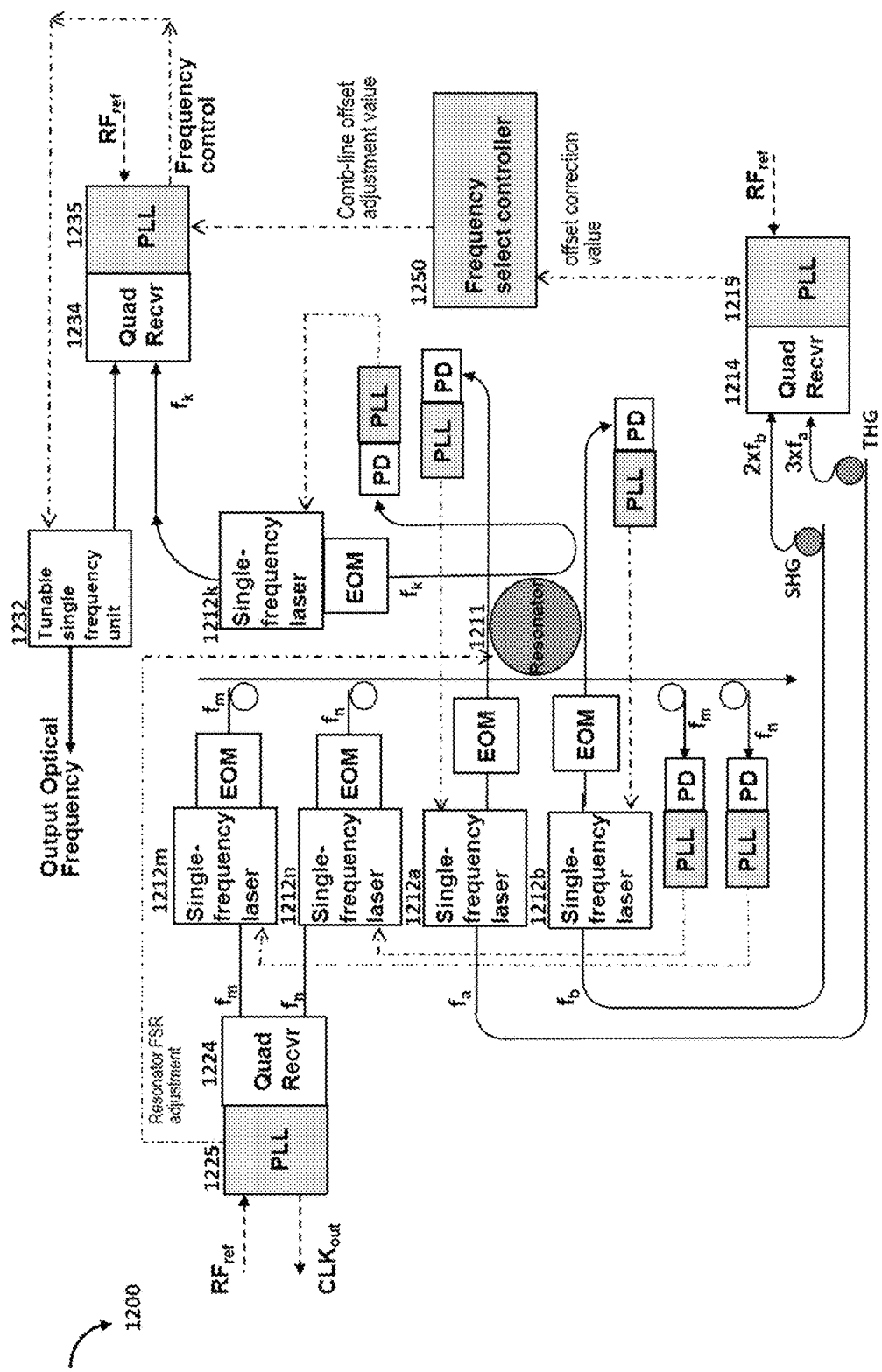
FIG. 12 illustrates component details inside of a semi-dormant reference comb generator and its interfaces to other units of the optical frequency synthesizer module architecture illustrated in FIG. 4, according to an embodiment of the present disclosure.

The system 1200 illustrated in FIG. 12 provides some details according to another embodiment of the present disclosure. FIG. 12 illustrates an example implementation of the OF synthesizer architecture embodiment 400 of FIG. 4. It particularly details the semi-dormant reference comb generator unit of the synthesizer and its interfaces. The reference comb generating unit comprising a resonator 1211, single frequency lasers 1212*a* and 1112*b* that active comb lines at frequencies $f_a$ and $f_b$, and lasers 1212*m* and 1212*n* that activate comb lines at frequencies $f_m$ and $f_{m+1}$, and a quadrature receiver 1214 that interfaces to a PLL circuit 1215. The OF synthesizer also includes a quadrature receiver 1224 that interfaces to a PLL circuit 1225 and that receives a part of the light produces by the lasers 1212*m* and 1212*n*. A single frequency laser 1213 activates the comb line at frequency $f_k$. The tunable single frequency laser unit of the synthesizer comprises an output single line laser 1232, a quadrature receiver 1234 and an offset PLL controller 1235. The system 1200 also illustrates interfaces between the various units in this embodiment, including the RF reference oscillator, which produces the RF reference signal, and the frequency select controller 1250.

The resonator 1211 of the system 1200 has four taps made to it, although in some cases it may be sufficient to use only three taps. A first tap is used to couple light of frequencies $f_m$ and $f_{m+1}$ (and in some cases also $f_k$) to/from the resonator. A second tap is used to couple light to/from the resonator whose frequency $f_a$ is at the low-frequency (longer wavelength) end of the semi-dormant comb. A third tap is used to couple light whose frequency $f_b$ is approximately 1.5 times greater than the frequency $f_a$. The frequency $f_b$ is at the high-frequency (shorter wavelength) end of the semi-dormant comb. The frequencies $f_m$ and $f_{m+1}$ (and in some cases also $f_k$) are near the center of the semi-dormant comb. These three sets of frequencies are chosen to be relatively far apart. Thus, the first tap is essentially not noticed by the frequencies of light coupled by the second tap or by the third tap. The second tap is not noticed by the frequencies of light coupled by the first tap and the third tap. And, the third tap is not noticed by the frequencies of light coupled by the first tap and the second tap. As a result, the Q of the resonator can remain high for a given frequency, without being degraded by the presence of the additional taps.

For some embodiments, the tapped frequencies $f_m$ and $f_{m+1}$ are shifted as the desired output frequency of the synthesizer is changed. In that case, the additional laser at $f_k$ is not necessary, since essentially $f_m = f_k$. For other embodiments, the frequencies $f_m$ and $f_{m+1}$ that determine the resonator FSR remain fixed, such as being at the lower frequency end of the output span, and the laser at frequency $f_k$ is shifted when the output frequency $f_{out}$ is changed. For synthesizers having a very wide output span, it may be necessary to use a fourth tap to couple the light at frequency $f_k$ to/from the reference resonator, such as illustrated in FIG. 12.

As illustrated in FIGS. 11 and 12, two other frequencies $f_a$ and $f_b$ of the reference comb are activated by PDH locking two other lasers, e.g., 1212a and 1212b, whose output light are coupled into the resonator, via two additional taps, optical phase modulators and feed waveguides. In an embodiment, these two additional frequencies $f_a$ and $f_b$ are approximately an octave apart. Thus, frequency $f_b$ is approximately equal to $2 \times f_a$. Since the frequency of that light is different by an octave, the "effective refractive index" for that light would be very different from the "effective refractive index" for the light at frequency $f_m$ or even at frequency $f_k$. The embodiments illustrated in FIGS. 11 and 12 illustrates cases for which $f_b$ is 1.5 times greater than $f_a$. Some of the light at frequency $f_b$ is coupled to a second harmonic generator (SHG) and produces frequency $2 \times f_b$ and some of the light at frequency $f_a$ is coupled to a generator (THG) of third harmonic light and produces frequency $3 \times f_a$. The light at frequency $3 \times f_a$ and the light at frequency $2 \times f_b$ can be coupled to a quadrature receiver 1214 to obtain an RF signal that equals the difference between those two optical frequencies. In one of the examples discussed above, $2 \times f_b$ 480 THz and $3 \times f_a \approx 480$ THz. If the resonator had zero dispersion, those two frequencies would be equal. The difference between those two frequencies provides an indication of the slope of the dispersion characteristic. That difference can be measured by the phase/frequency detector and frequency counter in the phase-locking electronics. That difference value is supplied to the frequency select controller 1150 and 1250 respectively.

Figure 13:
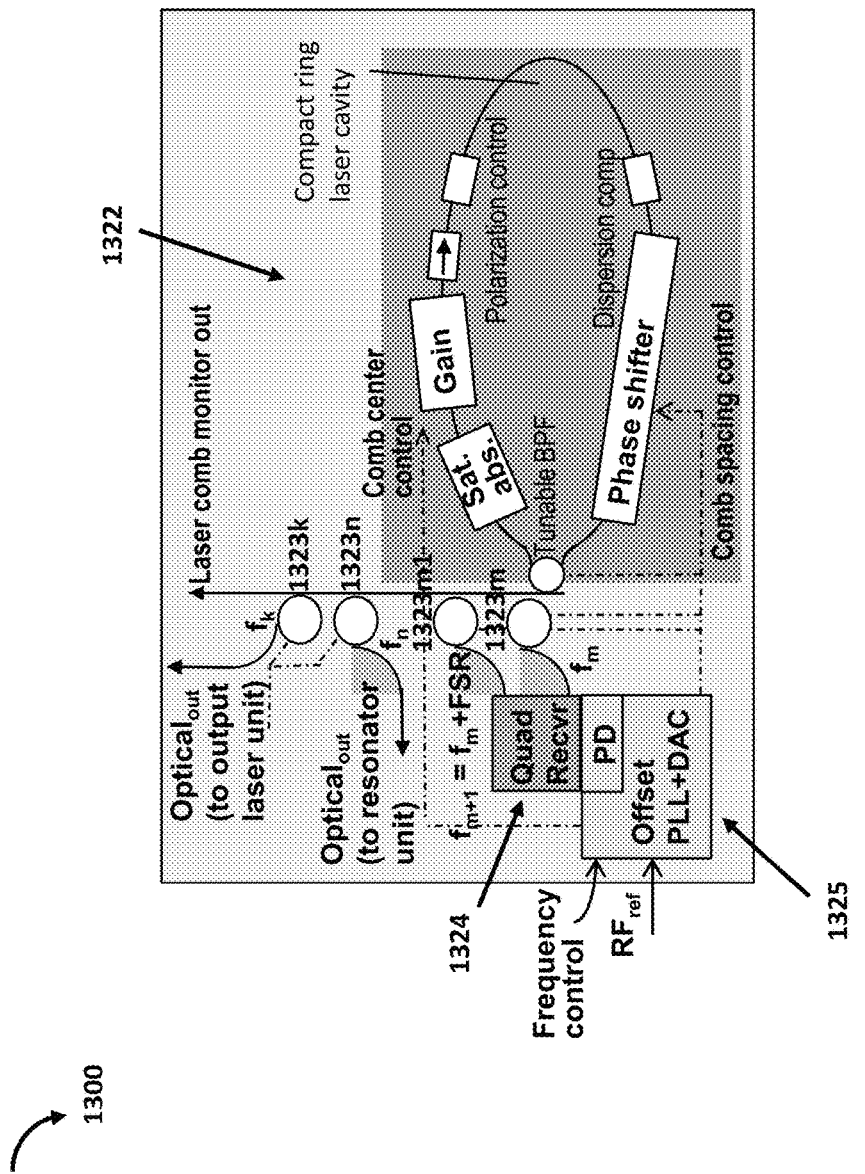
FIG. 13 illustrates an example of a mode-locked laser unit of the synthesizers, according to an embodiment of the present disclosure.

FIG. 13 illustrates one embodiment of the mode-locked laser unit 1300 of the synthesizer. This comprises a laser 1322 that has a ring-cavity configuration, with the light passing through each component of the ring only once in each round trip through the laser resonator. Other configurations such as linear-cavity resonators, with the light passing through each component twice (in opposite directions), also could be used. In addition to the laser, the unit also includes a photonic quadrature receiver as shown in the unit 1324, a phase-locking and waveform-generating electronic circuit as shown in the unit 1325, and several micro-ring-resonator, tone-selection filters/couplers as shown by 1323m, 1323m1, 1323n and 1323k. Pulses can be induced to form in the laser cavity by actively modulating the attenuation of light by a loss element in the laser cavity, for active mode locking, or by using a loss element whose absorption of light is reduced when the intensity of the light is sufficiently high (e.g., a saturable absorber), for passive mode locking. A phase modulator in the laser cavity can adjust the effective round-trip propagation time of the cavity, to control the tone-to-tone spacing of the comb produced by the laser.

FIG. 11 and FIG. 13 illustrate two slightly different embodiments. As illustrated in FIGS. 11 and 13, the mode-locked laser produces frequencies $f_m$, $f_{m+1}$, $f_n$ and $f_k$. A micro-ring resonator filter/coupler 1323m, located external to the mode-locked laser cavity, selects a tone of the laser comb (at frequency $f_m$) and couples it to the reference resonator (such as the resonator 1111 illustrated in FIGS. 11) via an optical phase modulator (such as EOM 1117m). Another micro-ring resonator filter/coupler 1323n, likewise located external to the laser cavity, selects another tone of the laser comb (at frequency $f_{mn}$) and couples it to the reference resonator via another optical phase modulator (such as EOM 1117n). The modulated light at frequency $f_m$ from the reference resonator is coupled to a PDH locking circuit that controls the gain of the mode-locked laser in order to align $f_m$ to a selected line of the reference comb. The modulated light at frequency $f_n$ from the reference resonator 1111 is coupled to a PDH locking circuit. As illustrated in FIG. 11, that PDH locking circuit includes EOM 1117n, photodetector 1118n and phase-locking loop electronics 1119n. In one embodiment, as illustrated in FIG. 11, the PDH locking circuit with loop electronics 1119n can control the phase shifter within the mode-locked laser to adjust the FSR of the mode-locked laser produced comb such that the frequency $f_n$ is aligned to another selected line of the reference comb. In general, the difference between $f_n$ and $f_m$ would correspond to the FSR of the reference comb. In this embodiment, a control signal from phase-locking loop electronics 1125 controls the FSR of the reference resonator in order to adjust the reference comb.

The two micro-ring resonator filters 1323m and 1323m1, located external to the laser cavity, select mode-locked laser light at frequencies $f_m$ and $f_{m+1}$ in the laser-produced comb and couple them to an optical quadrature receiver 1324 that is electrically coupled to a frequency/phase detector and phase-lock loop electronics 1325, which produces an output signal. In the embodiment illustrated in FIG. 13, that output signal adjusts the phase shifter within the mode-locked laser to maintain a desired difference between the frequencies of those selected tones, as determined by the RF reference signal supplied from the RF reference oscillator. This adjustment also sets the pulse-repetition rate of the mode-locked laser and the FSR of the laser-produced comb. Since the frequency $f_n$ also is produced by the mode-locked laser, the difference between $f_n$ and $f_m$ is a multiple of the mode-locked laser FSR. In this embodiment, the output from the PLL circuit 1119n of the PDH controller is used to adjust the FSR of the reference resonator in order to keep the selected mode of that reference resonator aligned with the frequency $f_n$.

Alternatively, in the embodiment illustrated in FIG. 11, the modulated light at frequency from the reference resonator can be coupled to a PDH locking circuit, which includes PLL circuit 1119$n$, that controls the optical-cavity delay and thus the FSR of the mode-locked laser in order to align $f_n$ to a selected line of the reference comb. In this latter case, the phase-locking loop based on quadrature receiver 1124 and electronic 1125 controls the FSR of the reference resonator (e.g., resonator 1111) in order to obtain a specific difference between the frequencies $f_{m+1}$ and $f_m$ and thus also a specific difference between the frequencies $f_n$ and $f_m$. Since both frequencies $f_m$ and $f_n$ output from the mode-locked laser also are PDH locked to resonator modes of the reference resonator 1111, and since a mode-locked laser has a the same FSR or frequency difference between each pair of its adjacent modes, or adjacent comb lines, this control of the reference resonator FSR can be done by monitoring the comb lines produced by the mode-locked laser at frequencies $f_m$ and $f_{m+1}$.

Another micro-ring resonator filter/coupler 1323$k$, located external to the mode-locked laser cavity, selects a tone of the laser comb at frequency $f_k$ also couples that light to the output laser unit, which is the tunable single-frequency laser unit 1132.

Figure 14:
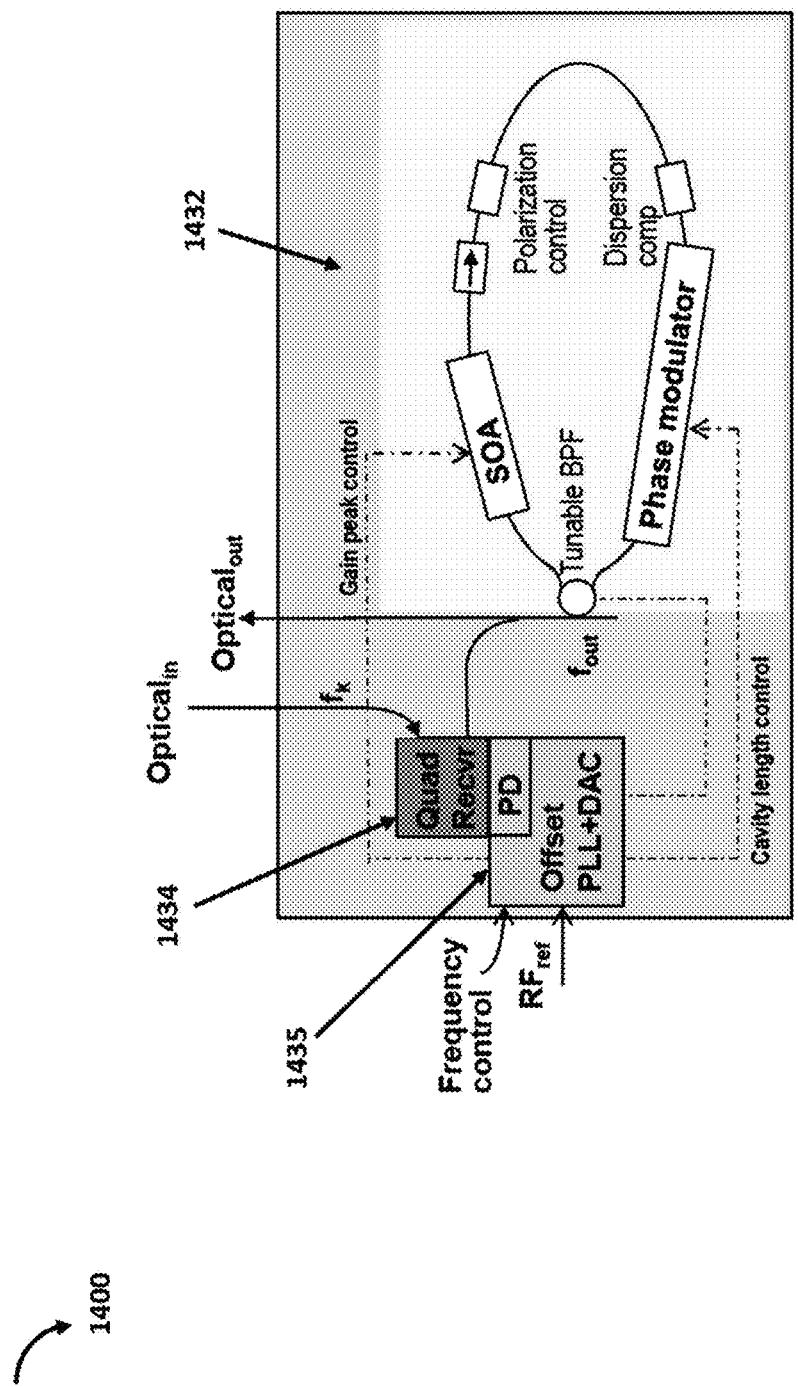
FIG. 14 illustrates an example of a tunable single-frequency output laser unit of the synthesizers, according to an embodiment of the present disclosure.

FIG. 14 illustrates one embodiment of the tunable single-frequency laser unit 1400 of the synthesizer, which could comprise the output stage of the synthesizer. The unit 1400 comprises of a laser 1432 that has a ring-cavity configuration, with the light passing through each component of the ring only once in each round trip through the laser resonator. Other configurations such as linear-cavity resonators, with the light passing through each component twice (in opposite directions), also could be used. In addition to the laser, the unit also includes a photonic quadrature receiver 1434 and a frequency-offset phase-locking and waveform-generating electronic circuit 1435. The ring laser cavity contains means for favoring uni-directional propagation of the laser light, means for polarization selection, means for dispersion control, means for optical phase (or refractive index) modulation, and means for optical amplification. The means for optical amplification could comprise a semiconductor optical amplifier (SOA). This ring laser cavity also could contain a tunable optical filter. This optical filter ensures the single-frequency operation of the laser by attenuating the other longitudinal modes of the laser cavity. The frequency $f_{out}$ of the light produced by this laser can be changed by adjusting the drive current of the SOA and thus its gain spectrum and by tuning the optical filter. The tight of frequency $f_{out}$ produced by this output laser and the mode-locked laser comb light (or, alternatively, the probe light for the reference resonator) at frequency $f_k$ are both coupled to the photonic quadrature receiver of this unit. The associated phase-locking circuit controls the phase modulator of this unit to achieve and maintain the specified frequency offset between frequencies $f_k$ and $f_{out}$.

As illustrated in FIGS. 11 and 12, the phase-locking controller circuit supplied by light of frequencies $f_m$, $f_{m+1}$ can generate an electronic clock waveform. For the embodiments of FIG. 12, the frequency of this clock waveform equals the free-spectral range $FSR_{m,m+1}$, which also is the spacing of the adjacent comb lines in the reference comb (see FIG. 7). For the embodiments illustrated in FIGS. 11 and 13, the phase-locking controller circuit supplied by light at frequencies $f_m$ and $f_{m+1}$ from the mode-locked laser can generate an electronic clock waveform whose frequency equals the optical-pulse repetition rate of the mode-locked laser or the line spacing. For these embodiments, the line spacing of the reference comb is a multiple of this clock frequency (see FIG. 3). Incidentally, the clock frequency also could be one-half that value without incurring significant electronic-divider noise. The clock waveform is used in some of the other phase-locking electronic circuits of the synthesizer to clock their frequency counters. By generating a clock waveform via the photo-detected optical frequencies, the synthesizer can avoid needing a separate electronic circuit that synthesizes the clock waveform from the RF reference. The generated clock waveform also could be divided to produce a lower-frequency waveform for modulating the optical phase modulators used for the PDH locking.

Figure 15:
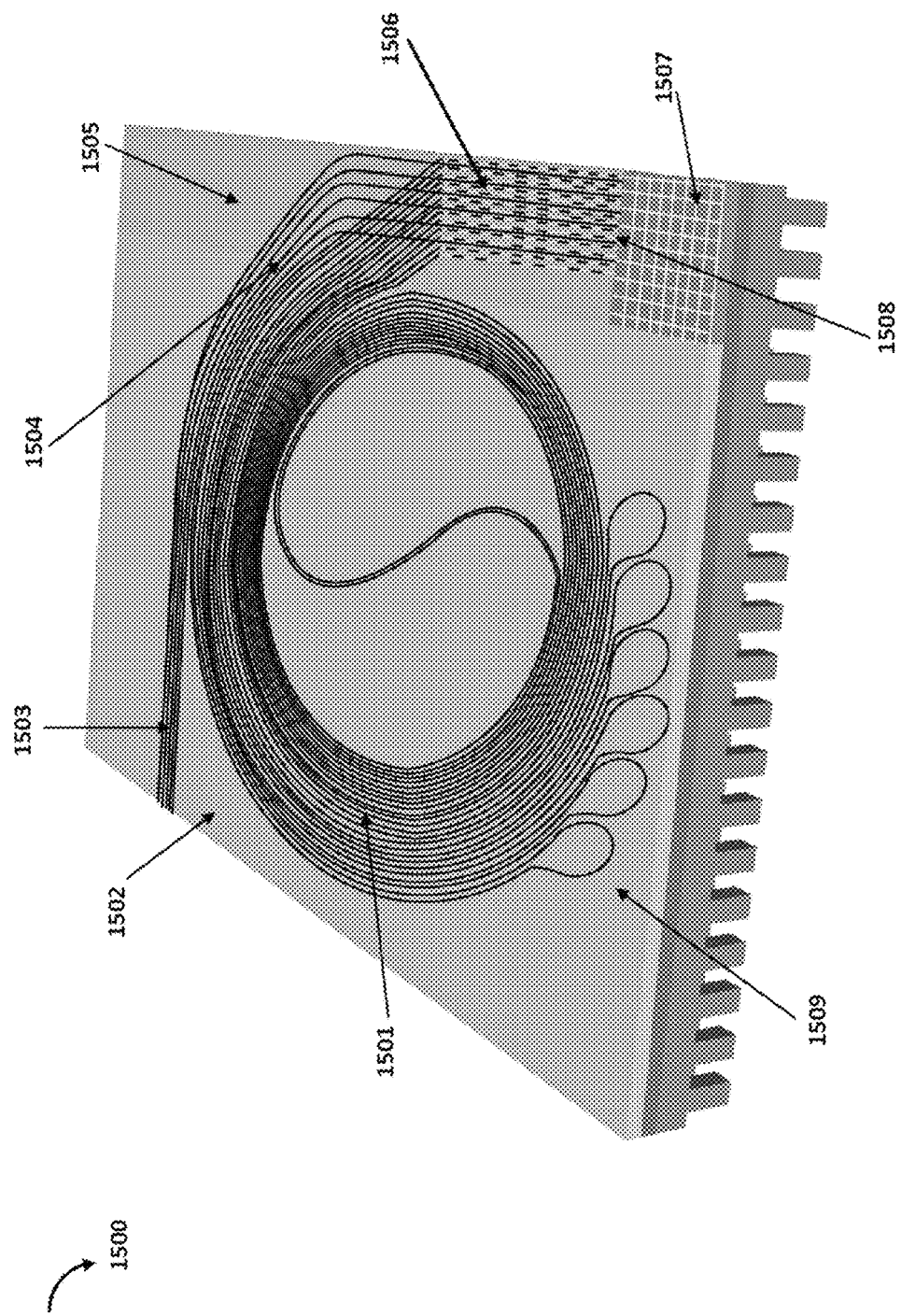
FIG. 15 illustrates a system-on-a-chip embodiment that features component technologies to implement an OF synthesizer on a single substrate, according to an embodiment of the present disclosure.

FIG. 15 illustrates a system-on-a-chip embodiment 1500 that features component technologies to implement an OF synthesizer on a single substrate. The integrated system 1500 uses chip-scale photonic components along with low-loss optical waveguides. The monolithic fabrication of this synthesizer 1500 can include several lasers and/or resonators 1501 nested in a spiral configuration, integrated optic chips with low loss $SiN_x/SiO_2$ waveguides 1502, optical I/O waveguides 1503, high throughput optical coupling interfaces 1504, active photonics chips 1505, integrated SOAss modulators, micro-resonators and couplers 1506, integrated photo detectors (PD) 1508, and integrated low power CMOS electronic chips 1507—all on a single substrate.

As an example, a compact generator of second-harmonic light, a compact generator of third-harmonic light, a frequency tunable mode-locked laser monolithically integrated with phase-locking electronic circuits, and a tunable single-frequency laser with phase-locking electronic circuits, all can be integrated on a common substrate.

Figure 4:
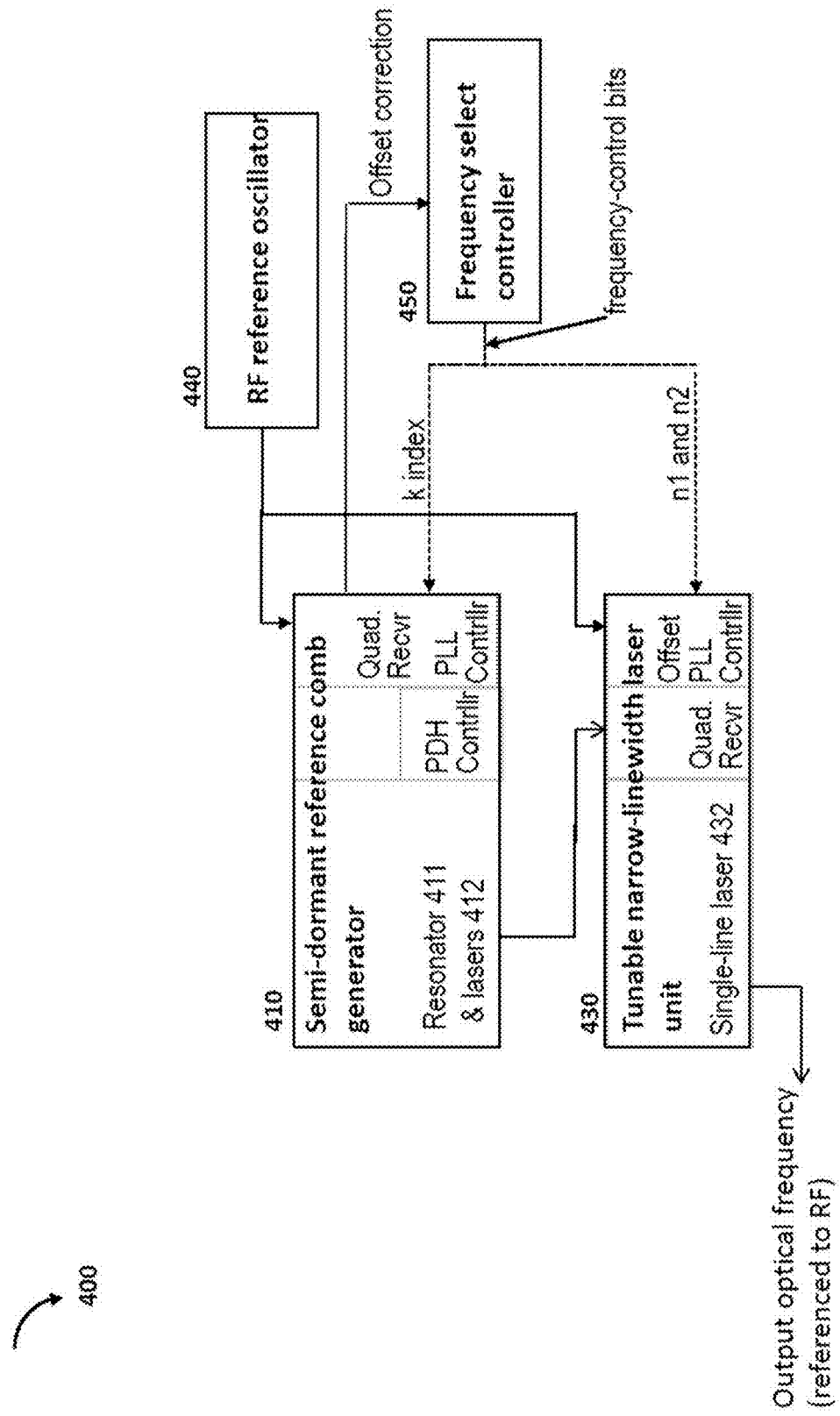
FIG. 4 illustrates another optical frequency synthesizer according to an embodiment of the present disclosure.

The reference resonator of FIG. 4 and the primary reference resonator of FIG. 1 can be constructed from optical waveguides that have low loss. The waveguide loss determines the Q of the resonator and the linewidth of the resonance peaks or comb lines of the comb associated with the resonator modes. To implement the PDH phase locking, the linewidth of those resonance peaks should be several times smaller than the spacing between adjacent comb lines. For example, channel waveguides with a silicon core region and silicon dioxide cladding can have a loss of 1.1-1.4 dB/cm. If we consider a resonator constructed from such $Si/SiO_2$ waveguides whose FSR is 400 GHz and whose effective index for light of 1550 nm wavelength is approximately 2.5, the round-trip path length of that resonator would be 0.03 cm. Thus, the loss per round trip would be 0.042 dB. The light could travel 71 round trips through the waveguide resonator before the intensity of that light is reduced to 50% of the original in-coupled intensity and the finesse of the resonator would be 71. Such a resonator should enable the PDH locking technique to be implemented with sufficient signal-to-noise ratio.

Other channel waveguides that have a silicon nitride core and silicon dioxide cladding can also be considered. The loss achieved for these waveguides is below 0.1 dB/cm and, for certain designs of such waveguides is below 0.03 dB/cm. As another example, consider a resonator constructed from such $SiN_x/SiO_2$ waveguides whose FSR is 5 GHz and whose effective index for light of 1550 nm wavelength is approximately 1.8. The round-trip path length of that resonator would be 3.33 ctn. Thus, the loss per round trip would be 0.1 dB for the lower-loss waveguide designs. The light could travel 30 round trips through the waveguide resonator before the intensity of that light is reduced to 50% of the original in-coupled intensity and the finesse of the resonator would be 30. Such a resonator should enable the PDH locking technique to be implemented with sufficient signal-to-noise ratio in many cases. A higher signal-to-noise ratio could be achieved if the waveguide loss is further reduced or if the resonator is made smaller and its FSR is higher.

The dispersion of suitably designed $Si/SiO_2$ waveguides can be sufficiently small (e.g., magnitude less than 1,000 psec/nm·km) for optical wavelengths greater than 1300 nm. A low-dispersion waveguide design may also limit the range of wavelengths to values smaller than 2000-2500 am. The dispersion of suitably designed $SiN_x/SiO_2$ waveguides likewise can be sufficiently small (e.g., <1,000 psec/nm·km) for optical wavelengths between roughly 1300 nm and 1900 am. A frequency ratio of 1.5× is reasonable for $f_b/f_a$ given this constraint on the wavelength span for the reference resonator. Generators of second-harmonic light can be designed using common material such as periodically poled lithium niobate. Fairly efficient generation (>10% efficiency) of third-harmonic light also can be accomplished with periodically poled lithium niobate. The third harmonic generation (THG) is accomplished by a cascade of two non-linear processes—second harmonic generation (SHG) and sum-frequency generation. To accomplish the THG, phase matching is required for both processes. Multi-grating patterns, chirped gratings or photonic crystal structures may be needed to achieve the desired phase matching.

A monolithically integrated (single-chip) mode-locked laser can be built that generates an OF comb whose comb-line spacing is smaller than 5 GHz and as small as 1 GHz. The laser includes a passive waveguide as part of its optical cavity. The laser, fabricated from InP-based materials, also includes sections of semiconductor optical amplifier and saturable absorber. An example of this laser emits light at ~1578 nm wavelength.

A single-chip, monolithically integrated, frequency tunable mode-locked laser can also be built. The laser includes one or more phase shifting or phase tuning sections in addition to the saturable absorber and semiconductor optical amplifier sections. One such laser can achieve continuous frequency tuning over a >40 MHz frequency span for 18 GHz pulse repetition rate (and comb spacing), and produced a comb whose spectral width is 5.3 nm (>660 GHz).

Other mode-locked laser chips can be built that contain monolithically integrated optoelectronic receivers and can be combined with optical-phase locking electronics to demonstrate the phase locking of a mode-locked laser to another laser. For example, such a compact unit can have a phase locking loop bandwidth of 790 MHz, which is more than sufficient to stabilize the frequencies of the MLL comb.

A widely tunable single-frequency laser that is integrated with an optoelectronic quadrature receiver can also be built. The receiver can have four photo-detectors and can be capable of in-phase and quadrature detection. This allows both the magnitude and sign of a phase difference between two optical inputs to be determined. The receiver/laser chip can be combined with an electronic single-sideband mixer circuit and phase-frequency difference detector circuit and additional phase-locked loop electronics. An RF tone can be inserted into the mixer circuit to accomplish the phase locking with a frequency offset. Phase locking with frequency offsets ranging from −9 GHz to +7.5 GHz can be obtained. The loop bandwidth of around 400 MHz can be achieved easily.

The OF synthesizer of the present disclosure can be constructed using optical resonator structures fabricated in silicon, silica or silicon nitride that have sufficiently low loss. The OF synthesizer also can be constructed using InGaAsP/InP mode-locked lasers and single-frequency tunable lasers. Some of these lasers can been monolithically integrated with InGaAsP/InP optical-phase modulators. Phase modulators coupled to lasers would be needed to implement the Pound-Drever-Hall (PDH) locking technique. These lasers even can be integrated monolithically with silicon, silica and silicon nitride waveguides. These lasers also have been hybrid integrated with electronic phase-locking circuits. With advancements in semiconductor technology, it has become possible to achieve an OF synthesizer that has hand-held or even chip-scale size.

It should be possible to use the fabrication methods discussed above for optical waveguides and non-linear optical components for SHG and THG as well as the mode-locked lasers, tunable single-frequency lasers, optoelectronic receivers and phase-locking electronics to construct the components of the OF synthesizer.

The OF synthesizers disclosed in the present disclosure can be a hand-held, battery powered device that produces >$10^{10}$ distinct optical frequencies. The span of possible frequency values produced by the disclosed synthesizer is determined by the gain bandwidth of the mode-locked laser and also by the gain bandwidth of the tunable output laser. This span can be as large as several tens of nm or more. High precision is achieved because the phase locking between a pair of lasers is controlled by phase locking those lasers to the reference resonator, whose mode spacing is locked to a value derived from the RF reference tone. Also a precise estimate of the absolute frequency of a reference resonator mode is obtained by making a comparison with the frequency of the RF reference. Since the OF tone output from the optical synthesizer is phase-locked to the RF reference, it can have a stability and precision comparable to that of the RF reference. A frequency precision of 100 Hz or better can be achieved routinely for many available RF references.

An optical synthesizer whose OF output can be stabilized by an RF reference and also can be varied as programmed would be useful for secure optical communications and LiDAR applications. The synthesized optical frequency can be varied in a way known to the user but not known to others. Such frequency variations are analogous to some spread spectrum techniques used in RF communications and RADAR applications. The absolute frequency of the OF output can have a value derived from the RF reference tone. An OF synthesizer generating an absolute frequency output would be useful for spectroscopy and chemical sensing applications and also for some timing or synchronization applications. Several applications require compact frequency-tunable optical sources for LiDAR and range finding. The range-determination achieved by using a frequency chirp is well known. There is a need for chemical sensors in manufacturing facilities, such as for monitoring of hazardous materials or for monitoring of chemical reactions.

Some embodiments of the disclosed synthesizer makes use of recently developed electronic circuit techniques, such as digital accumulators and comparators, to accomplish phase locking with digitally specified frequency offsets. The disclosed synthesizer also can make use of recently developed digital electronic circuits capable of frequency and phase discrimination with low power consumption.

Modifications, additions, or omissions may be made to the systems, apparatuses, and methods described herein without departing from the scope of the technology. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. An optical frequency (OF) synthesizer comprising:
a mode-locked laser;
an output laser; and
a resonator having resonant frequencies at optical coarse-comb lines,
a first laser and a second laser coupled to the resonator and activating first and second coarse-comb lines of the resonator,
the mode-locked laser generating optical fine-comb lines, wherein two non-adjacent fine-comb lines are locked to third and fourth coarse-comb lines of the resonator, the third and fourth comb lines being located in frequency between the first and second coarse-comb lines, and wherein
the output laser is locked to a fine-comb line located in frequency between the two non-adjacent fine-comb lines that are locked, wherein the output laser is tuned to account for an offset correction computed from using outputs from one or more of the first and second lasers, the mode locked laser and the output laser.

2. The OF synthesizer of claim 1, wherein the resonator is coupled to at least three Pound-Drever-Hall (PDH) controllers.

3. The OF synthesizer of claim 1, wherein the mode locked laser is coupled to a quadrature receiver and a phase-locking loop (PLL) controller.

4. The OF synthesizer of claim 1, wherein the output laser is a tunable laser and is coupled to a quadrature receiver and an offset PLL controller.

5. The OF synthesizer of claim 1, further comprising a frequency select controller that controls selection of the coarse-comb lines that are coupled to the mode-locked laser.

6. The OF synthesizer of claim 5, wherein the frequency select controller also controls selection of the fine-comb line to which the output laser is locked.

7. The OF synthesizer of claim 5, wherein the frequency select controller also controls adding additional frequency offsets to the output laser optical frequency that are derived from the RF reference frequency.

8. The OF synthesizer of claim 1, wherein the resonator has non-zero dispersion in the range of frequencies associated with the first and second coarse-comb lines.

9. The OF synthesizer of claim 1, wherein the coarse-comb lines are more than 100 GHz apart.

10. The OF synthesizer of claim 1, wherein the fine-comb lines are less than 50 GHz apart.

11. The OF synthesizer of claim 1, wherein the coarse-comb lines are semi-dormant.

12. An optical frequency (OF) synthesizer comprising:
an output laser; and
resonator having resonant frequencies at optical comb lines, a first laser and a second laser coupled to first and second comb lines of the resonator;
a third laser coupled to a third comb line of the resonator located in frequency between the first and second comb lines and wherein
the output laser is locked to the third comb line, wherein the output laser is tuned to account for a frequency offset correction computed from using outputs from one or more of the first, second and third lasers and the output laser.

13. The OF synthesizer of claim 12, wherein the comb lines are semi-dormant.

14. The OF synthesizer of claim 12, wherein the resonator is coupled to at least three Pound-Drever-Hall (PDH) controllers.

15. The OF synthesizer of claim 12, wherein the resonator is further coupled to a quadrature receiver and a phase-locking loop (PLL) controller.

16. The OF synthesizer of claim 12, wherein the output laser is a tunable laser and is coupled to a quadrature receiver and an offset PLL controller.

17. The OF synthesizer of claim 12, further comprising a frequency select controller that controls selection of the comb line that is coupled to the third laser.

18. The OF synthesizer of claim 17, wherein the frequency select controller also controls selection of the comb line to which the output laser is locked to.

19. The OF synthesizer of claim 17, wherein the frequency select controller also controls adding additional frequency offsets to the frequency offset correction of the output laser that are derived from the RF reference frequency.

20. The OF synthesizer of claim 1, wherein the resonator has non-zero dispersion in a range of frequencies associated with the first and second comb lines.

21. The OF synthesizer of claim 1, wherein the comb lines are less than 50 GHz apart.

22. An optical frequency (OF) synthesizer comprising:
a reference resonator having a plurality of modes;
a first laser and a second laser coupled to the resonator, wherein frequencies of light of the first and second lasers are locked to first and second frequencies of a first and a second mode of the plurality of modes;
a mode-locked laser generating optical fine-comb lines, wherein frequencies of two fine-comb lines are locked to frequencies of third and fourth modes of the plurality of modes; and
an output laser locked to a fine-comb line, a frequency of the fine-comb line being between the frequencies of the two fine-comb lines that are locked to the third and fourth modes of the resonator, wherein the output laser is tuned with outputs from at least one of the first and second lasers, the mode locked laser, and the output laser.

23. An optical frequency (OF) synthesizer comprising:
an output laser;
a reference resonator having a plurality of modes;
a first laser and a second laser coupled to a first and a second mode of the resonator;
a third laser coupled to a third mode of the resonator, a frequency of the third mode being between frequencies of the first and second modes of the resonator; and wherein
the output laser is locked to the third mode of the resonator, wherein the output laser is tuned with outputs from one or more of the first, second, and third lasers, and the output laser.

* * * * *